US007466065B2

(12) United States Patent
Sanpei et al.

(10) Patent No.: US 7,466,065 B2

(45) Date of Patent: Dec. 16, 2008

(54) BIMORPH SWITCH, BIMORPH SWITCH MANUFACTURING METHOD, ELECTRONIC CIRCUITRY AND ELECTRONIC CIRCUITRY MANUFACTURING METHOD

(75) Inventors: Hirokazu Sanpei, Tokyo (JP); Jun Mizuno, Saitama (JP); Masazumi Yasuoka, Tokyo (JP); Humikazu Takayanagi, Tokyo (JP); Takehisa Takoshima, Miyagi (JP); Masaru Miyazaki, Tokyo (JP); Masayoshi Esashi, 1-11-9, Yagiyama-minami, Taihaku-ku, Sendai-shi, Miyagi (JP) 982-0807

(73) Assignees: Advantest Corporation, Tokyo (JP); Masayoshi Esashi, Miyagi (JP)

( * ) Notice: Subject to any disclaimer, the term of this patent is extended or adjusted under 35 U.S.C. 154(b) by 13 days.

(21) Appl. No.: 11/504,381

(22) Filed: Aug. 15, 2006

(65) Prior Publication Data

US 2006/0273692 A1 Dec. 7, 2006

Related U.S. Application Data

(60) Division of application No. 11/040,502, filed on Jan. 21, 2005, which is a continuation of application No. PCT/JP03/07905, filed on Jun. 23, 2003.

(30) Foreign Application Priority Data

Jul. 22, 2002 (JP) ............................ 2002-213202

(51) Int. Cl.

*H01L 29/00* (2006.01)

*H01L 41/08* (2006.01)

*H03H 11/24* (2006.01)

(52) U.S. Cl. ...................................... 310/330; 200/181

(58) Field of Classification Search ........... 310/330–32; 200/181; 335/78

See application file for complete search history.

(56) References Cited

U.S. PATENT DOCUMENTS

| | | | | | |
|---|---|---|---|---|---|
| 4,093,883 | A | * | 6/1978 | Yamamoto | 310/317 |
| 4,360,743 | A | * | 11/1982 | Stokes | 327/455 |
| 4,626,951 | A | * | 12/1986 | Nagao | 361/8 |
| 5,491,427 | A | * | 2/1996 | Ueno et al. | 324/754 |

(Continued)

FOREIGN PATENT DOCUMENTS

DE 10340619 A1 * 4/2005

(Continued)

OTHER PUBLICATIONS

Japanese Office Action for Japanese Application No. 2002-213202, mailed on Nov. 6, 2007 (6 pages).

*Primary Examiner*—J. San Martin

(74) *Attorney, Agent, or Firm*—Osha Liang LLP

(57) ABSTRACT

A bimorph switch electrically connecting a traveling contact and a fixed contact. The switch comprises a substrate having a front face, a rear face, and a through hole penetrating from the front face to the rear face; a fixed contact extending from an edge portion of the aperture of the through hole towards the inside of the aperture; and a bimorph section holding the traveling contact at a position facing the aperture and driving the traveling contact. One end of the bimorph section may be formed on a silicon oxide layer formed on a front face of the substrate.

4 Claims, 21 Drawing Sheets

U.S. PATENT DOCUMENTS

| | | | | |
|---|---|---|---|---|
| 6,034,443 | A * | 3/2000 | Oliemuller et al. | 307/70 |
| 6,051,895 | A * | 4/2000 | Mercier | 307/125 |
| 6,064,126 | A * | 5/2000 | Beardmore | 307/112 |
| 7,079,363 | B2 * | 7/2006 | Chung | 361/13 |
| 2002/0171121 | A1 * | 11/2002 | Ozgur | 257/532 |

FOREIGN PATENT DOCUMENTS

| | | |
|---|---|---|
| JP | 2-126528 A | 5/1990 |
| JP | 04-269416 | 9/1992 |
| JP | 11-260178 | 9/1999 |

* cited by examiner

100

136

BIMORPH SWITCH, BIMORPH SWITCH MANUFACTURING METHOD, ELECTRONIC CIRCUITRY AND ELECTRONIC CIRCUITRY MANUFACTURING METHOD

The present application is a divisional application of U.S. patent application Ser. No. 11/040,502, filed on Jan. 21, 2005, which is a continuation application of PCT/JP2003/007905 filed on Jun. 23, 2003, claiming priority from a Japanese patent application No. 2002-213202 filed on Jul. 22, 2002, the contents of which are incorporated herein by reference.

BACKGROUND OF THE INVENTION

1. Field of the Invention

The present invention relates to a bimorph switch, a bimorph switch manufacturing method, an electronic circuitry, and an electronic circuitry manufacturing method.

2. Description of Related Art

Conventionally, the bimorph switch is known as an MEMS switch. The bimorph switch is formed by bonding a silicon substrate where the bimorph is formed and a glass substrate.

However, in order to bond the silicon substrate and the glass substrate conventionally, there was a problem that a manufacturing process became complicated.

Therefore, it was difficult to provide a low cost bimorph switch conventionally.

Therefore, it is an object of the present invention to provide a bimorph switch, a bimorph switch manufacturing method, an electronic circuitry, and an electronic-circuitry manufacturing method which can solve the above-mentioned problems. The above and other objects can be achieved by combinations described in the independent claims. The dependent claims define further advantageous and exemplary combinations of the present invention.

SUMMARY OF INVENTION

To achieve such an object, according to a first aspect of the present invention, there is provided a bimorph switch which connects a traveling contact and a fixed contact electrically. The bimorph switch includes: a substrate which includes a front face, a rear face, and a through hole penetrating from the front face to the rear face; the fixed contact extending from an edge of an aperture of the through hole towards inside of the aperture; and a bimorph section holding the traveling contact operable to drive the traveling contact.

According to a second aspect of the present invention, there is provided a bimorph switch manufacturing method for manufacturing a bimorph switch which connects a traveling contact and a fixed contact electrically. The bimorph switch manufacturing method includes: a fixed contact formation step of forming the fixed contact on a front face of a substrate; a sacrificial layer formation step of forming a sacrificial layer which covers the fixed contact on a front face of the substrate; a bimorph section formation step of forming a bimorph section operable to drive the traveling contact on the sacrificial layer; a removal step of removing a portion of the sacrificial layer which covers at least a part of the fixed contact; and a traveling contact formation step of forming the traveling contact on a front face of the bimorph section facing the substrate. The substrate may be etched so that it penetrates from the rear face to the front face of the substrate and the sacrificial layer is removed in the removal step. The traveling contact may be formed by depositing a metal layer on a surface of the bimorph section facing the substrate in the traveling contact formation step.

According to a third aspect of the present invention, there is provided a bimorph switch which connects a traveling contact and a fixed contact electrically. The bimorph switch includes: a substrate holding the fixed contact; a bimorph section, which includes a first end, a second end, and an aperture, operable to drive the traveling contact; and a bimorph support section operable to support the first end and the second end of the bimorph section.

According to a fourth aspect of the present invention, there is provided an electronic circuitry formed on a substrate. The electronic circuitry includes: an integrated circuit which includes a first terminal and a second terminal and is formed on the substrate; and a mechanical switch mounted on the substrate operable to connect the first terminal and the second terminal electrically. The mechanical switch may be a bimorph switch, which includes a traveling contact, a fixed contact, and a bimorph section, operable to drive the traveling contact and electrically connects the first terminal and the second terminal by electrically connecting the traveling contact and the fixed contact.

The integrated circuit may include a semiconductor switch, and the mechanical switch has an off leakage current less than that of the semiconductor switch. The integrated circuit may include a semiconductor switch, and the mechanical switch switches greater current than that of the semiconductor switch. The integrated circuit may include a semiconductor switch, and the mechanical switch switches a signal of frequency higher than that of the semiconductor switch.

According to a fifth aspect of the present invention, there is provided an electronic circuitry manufacturing method for manufacturing the electronic circuitry which includes a mechanical switch and an integrated circuit. The electronic circuitry manufacturing method includes: a preparation step of preparing a substrate; an integrated circuit formation step of forming the integrated circuit on the substrate; a switch formation step of forming the mechanical switch; and a mounting step of mounting the mechanical switch on the substrate.

According to a sixth aspect of the present invention, there is provided a bimorph switch which connects a traveling contact and a fixed contact electrically. The bimorph switch includes: a substrate holding the fixed contact; a bimorph section operable to drive the traveling contact; a heat insulation section formed on a front face of the bimorph section having thermal conductivity lower than that of the bimorph section; and a bimorph support section facing the bimorph section across the heat insulation section, wherein the bimorph support section supports the bimorph section. The bimorph section may include: a first member formed of silicon oxide; and a second member formed of metal. The heat insulation section has thermal conductivity lower than that of any of the silicon oxide and the metal.

According to a seventh aspect of the present invention, there is provided a bimorph switch which connects a traveling contact and a fixed contact electrically. The bimorph switch includes: a substrate holding the fixed contact; a bimorph section operable to drive the traveling contact; and a bimorph support section operable to support the bimorph section. The bimorph section includes: a heater; a first member being in contact with the bimorph support section; a second member having a thermal conductivity higher than that of the first member and a coefficient of thermal expansion different from that of the first member, wherein the second member is formed on portions other than a domain where the first member contacts the bimorph support section among the surface of the first member being in contact with the bimorph support section, and the second member causes stress which deforms the bimorph section when it is heated by the heater.

According to an eighth aspect of the present invention, there is provided a bimorph switch which connects a traveling contact and a fixed contact electrically. The bimorph switch includes: a substrate holding the fixed contact; a bimorph section operable to drives the traveling contact; and a bimorph support section operable to support the bimorph section, wherein the bimorph section includes: a supported section fixed to the bimorph support section; a driving section operable to drive the traveling contact; and a reinforcement section formed from the supported section over a part of the driving section on a front face of the bimorph section. At least a part of the reinforcement section may be formed between the bimorph support section and the supported section. A part of the reinforcement section may face the bimorph support section across the supported section. The bimorph section may further include: a heater operable to heat the driving section; and a heater electrode electrically connecting with the heater, and the reinforcement section may extend from the heater electrode and may be integrally formed with the heater electrode.

According to a ninth aspect of the present invention, there is provided a bimorph switch which connects a traveling contact and a fixed contact electrically. The bimorph switch includes: a substrate holding the fixed contact; a bimorph section which includes a front face facing the substrate and a rear face corresponding to the front face, and a through hole penetrating from the front face to the rear face, wherein the bimorph section holds the traveling contact on the front face; a feedthrough wiring provided in the through hole and electrically connecting with the traveling contact; and a signal line provided on the rear face of the bimorph section and electrically connecting with the feedthrough wiring. The traveling contact may be integrally formed with the feedthrough wiring.

The summary of the invention does not necessarily describe all necessary features of the present invention. The present invention may also be a sub-combination of the features described above.

BRIEF DESCRIPTION OF THE DRAWINGS

FIGS. 10A-10I are drawings explaining operation of the bimorph switch according to the present embodiment, in which: FIG. 10A shows the bimorph switch in a case where a bimorph section holds a traveling contact without contacting a traveling and a fixed contact; FIG. 10B shows the bimorph switch when the bimorph section contacts the traveling contact and the fixed contact; FIG. 10C shows the bimorph switch in a case where the bimorph section holds the traveling contact without contacting the traveling contact and the fixed contact; FIG. 10D shows the bimorph switch when the bimorph section contacts the traveling contact and the fixed contact; FIG. 10E shows another example of the fixed contact according to the present embodiment; FIG. 10F shows another example of the fixed contact according to the present embodiment; FIG. 10G shows another example of the fixed contact according to the present embodiment; FIG. 10H shows another example of the fixed contact according to the present embodiment; and FIG. 10I shows another example of the fixed contact according to the present embodiment.

FIGS. 12A-12C are drawings explaining exemplary switch formation steps, in which: FIG. 12A is a drawing explaining a switch formation step; FIG. 12B is a drawing explaining a bonding step; and FIG. 12C is a drawing explaining a removal step.

FIGS. 15A and 15B show an exemplary bimorph switch according to a fifth embodiment of the present invention, in which: FIG. 15A is a cross sectional view of the bimorph switch; and FIG. 15B is a plan view of the bimorph switch.

FIGS. 16A and 16B show another example of the bimorph switch according to the present embodiment; in which: FIG. 16A is a cross sectional view of the bimorph switch; and FIG. 16B is a plan view of the bimorph switch.

FIGS. 17A and 17B show an exemplary bimorph switch according to a sixth embodiment of the present invention, in which: FIG. 17A is a cross sectional view of the bimorph switch; and FIG. 17B is a plan view of the bimorph switch.

FIGS. 18A-18C show another example of the bimorph switch according to the present embodiment, in which FIG. 18A shows another example of the bimorph switch; FIG. 18B shows another example of the bimorph switch; and FIG. 18C shows another example of the bimorph switch.

FIGS. 20A-20F are drawing explaining an exemplary bimorph switch manufacturing method for manufacturing the bimorph switch according to the present embodiment, in which: FIG. 20A is a drawing explaining a first step; FIG. 20B is a drawing explaining a second step; FIG. 20C is a drawing explaining a third step; FIG. 20D is a drawing explaining a fourth step; FIG. 20E is a drawing explaining a fifth step; and FIG. 20F is a drawing explaining a sixth step.

FIGS. 21A-21B are drawings explaining an exemplary bimorph switch manufacturing method for manufacturing the bimorph switch according to the present embodiment, in which: FIG. 21A is a drawing explaining a seventh step; FIG. 21B is a drawing explaining an eighth step.

DETAILED DESCRIPTION OF THE INVENTION

The invention will now be described based on preferred embodiments, which do not intend to limit the scope of the present invention, but exemplify the invention. All of the features and the combinations thereof described in the embodiments are not necessarily essential to the invention.

Figure 1:
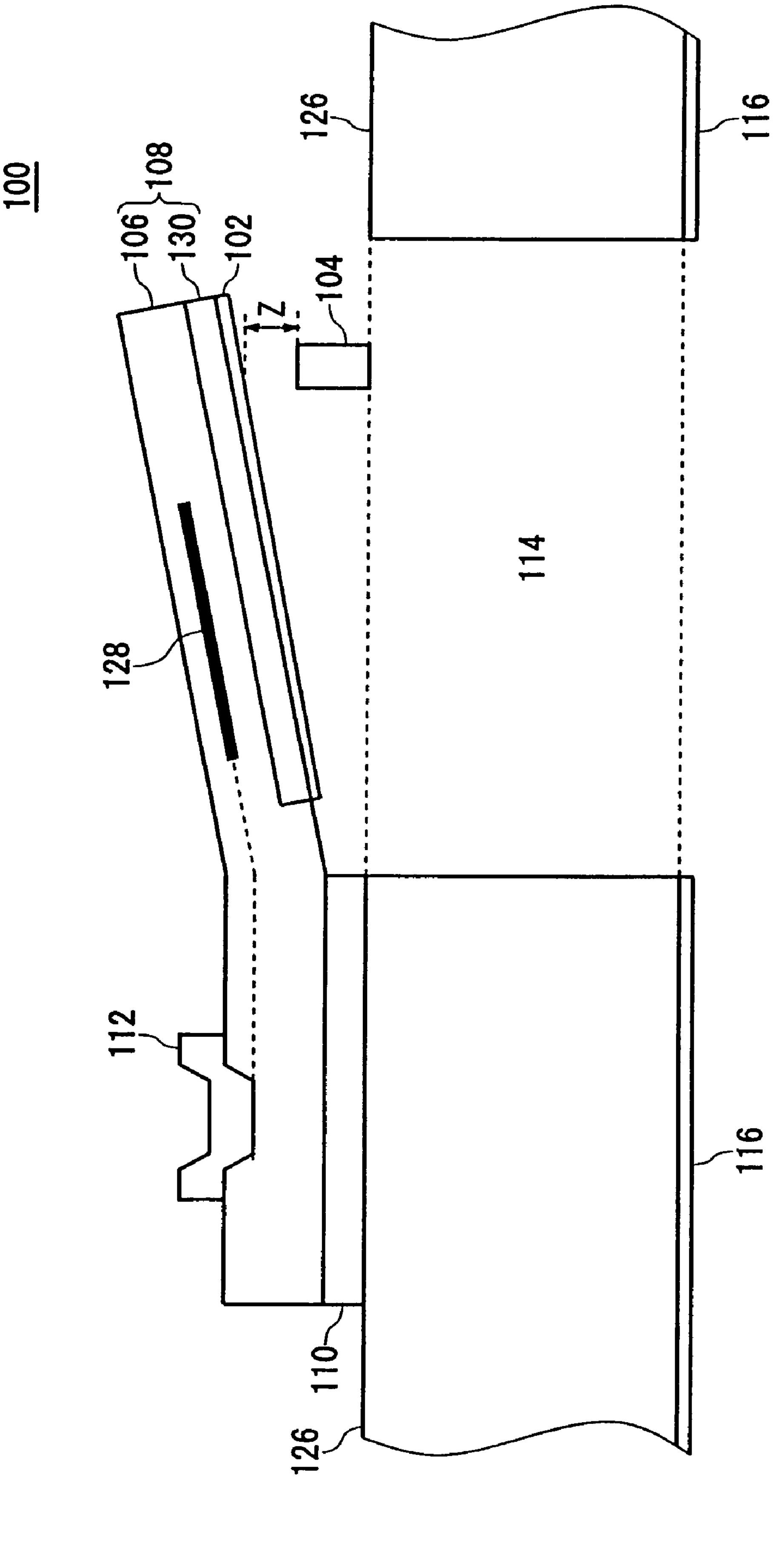
FIG. 1 is a cross sectional view of an exemplary bimorph switch according to a first embodiment of the present invention.

FIG. 1 is a cross sectional view of an exemplary bimorph switch 100 according to a first embodiment of the present invention. The bimorph switch 100 includes a traveling contact 102, a fixed contact 104, a substrate 126, a bimorph section 108, and a bimorph support layer 110.

The bimorph switch 100 is a cantilever switch which includes a cantilever. The bimorph switch 100 connects the traveling contact 102 and the fixed contact 104 electrically. The traveling contact 102 and a fixed contact 104 are contacts of the switch of the bimorph switch 100. The traveling contact 102 and the fixed contact 104 may be formed of metal.

The substrate 126 is a silicon substrate which holds a fixed contact 104 on its front face. The substrate 126 includes a front face and a rear face, and a through hole 114 penetrating from the front face to the rear face. The substrate 126 may hold the fixed contact 104 by making an end of the fixed contact 104 project into the aperture of the through hole 114 from the front face of the substrate 126. Moreover, the fixed contact 104 extends to inside of the aperture from an edge of the aperture of the through hole 114.

The bimorph section 108 is a portion corresponding to the cantilever of the bimorph switch 100. The bimorph section 108 faces the aperture of the through hole 114, and holds the traveling contact 102. The bimorph section 108 drives the traveling contact 102. The bimorph section 108 connects the traveling contact 102 and the fixed contact 104 electrically by driving the traveling contact 102. The bimorph section 108 has a tabular form substantially parallel to the front face of the substrate 126. The bimorph section 108 holds the traveling contact 102 on its front face facing the front face of the substrate 126.

The bimorph section 108 deforms according to temperature. The bimorph section 108 drives the traveling contact 102 by the deformation. The bimorph section 108 maintains the distance of displacement Z, which is predetermined according to temperature, between the fixed contact 104 and the traveling contact 102.

In the present embodiment, the bimorph section 108 includes a first member 106, a second member 130, a heater 128, and a heater electrode 112. The first member 106 is a low expansion member of the bimorph section 108. The first member 106 is formed of silicon oxide.

The second member 130 is a high expansion member of the bimorph section 108. The second member 130 is formed of metallic glass. The second member 130 is formed on a front face of the first member 106 facing the front face of the substrate 126. The second member 130 holds the traveling contact 102 on its front face facing to the front face of the substrate 126. The second member 130 holds a metal layer corresponding to the traveling contact 102 on substantially the whole surface of the front face.

The heater 128 is a heater which heats the bimorph section 108. The heater 128 is formed in the interior of the first member 106. Moreover, the heater electrode 112 is a metal electrode electrically connects with the heater 128.

The bimorph support layer 110 is an example of the bimorph support section which supports the bimorph section 108. In the present embodiment, the bimorph support layer 110 is a silicon oxide layer formed on the front face of the substrate 126. The bimorph support layer 110 is inserted and formed between the bimorph section 108 and the substrate 126. One end of the bimorph section 108 is formed on the bimorph support layer 110, and the bimorph support layer 110 supports the end of the bimorph section 108. In another example, the bimorph support layer 110 may hold both ends of the bimorph switch 100.

Moreover, the bimorph switch 100 further includes a rear face metal layer 116 on the rear face of the substrate 126. The rear face metal layer 116 is formed of the same metal as the traveling contact 102. The rear face metal layer 116 has substantially the same thickness as that of the traveling contact 102. The rear face metal layer 116 is formed by the same process as that of the traveling contact 102.

In another example, the bimorph support layer 110 may be formed of poly silicon. In this case, one end of the bimorph section 108 is formed on the bimorph support layer 110 which is a poly silicon layer formed on the front face of the substrate 126.

An example of the bimorph switch manufacturing method for manufacturing the bimorph switch 100 according to the present embodiment will be explained hereinafter. In the present embodiment, the bimorph switch manufacturing method includes a fixed contact formation step, a sacrificial layer formation step, a bimorph section formation step, a removal step, and a traveling contact formation step.

In the fixed contact formation step, the fixed contact 104 is formed on the front face of the substrate 126. In the fixed contact formation step, the fixed contact 104 is formed of metal. In the fixed contact formation step, the fixed contact 104 is formed for example, of gold (Au) plating.

In the sacrificial layer formation step, a sacrificial layer, which covers the fixed contact 104, is formed on the front face of the substrate 126. In the present embodiment, in the sacrificial layer formation step, a silicon oxide layer is formed as the sacrificial layer. In the sacrificial layer formation step, the sacrificial layer containing the silicon oxide layer is formed corresponding to the bimorph support layer 110. In another example, in the sacrificial layer formation step, a poly silicon layer may be formed as the sacrificial layer. In this case, the bimorph support layer 110 is formed of poly silicon.

In the bimorph section formation step, the bimorph section 108 is formed on the sacrificial layer. In the present embodiment, in the bimorph section formation step, the metallic glass layer corresponding to the second member 130 and the silicon oxide layer corresponding to the first member 106 are formed. In the bimorph section formation step, the metallic glass layer corresponding to the second member 130 is formed on the sacrificial layer, and the silicon oxide layer corresponding to the first member 106 is formed on the metallic glass layer.

In the bimorph section formation step, the first member 106 is formed by a first silicon oxide layer and a second silicon oxide layer. In the bimorph section formation step, the first silicon layer is formed on the metallic glass layer. In the bimorph section formation step, the heater 128 is formed on the first silicon oxide layer, and the second silicon oxide layer is formed on the first silicon oxide layer sandwiching the heater 128 therebetween. In the bimorph section formation step, the heater 128 is formed of, for example, Cr—Pt—Cr metal. In the bimorph section formation step, the heater electrode 112, which electrically connects with the heater 128, is further formed.

In the removal step, the portion on the sacrificial layer which covers at least a part of the fixed contact 104 is removed. In the removal step, the substrate 126 is etched so that it may be penetrated from the front face to the rear face of the substrate 126 and the sacrificial layer is removed. In the removal step, the through hole 114 is formed by the etching. In the present embodiment, in the removal step, the through hole 114 is formed, which includes an aperture at a portion where one end of the fixed contact 104 is formed on the front face of the substrate 126.

In the traveling contact formation step, the traveling contact 102 is formed on a front face of the bimorph section 108 facing the front face of the substrate 126. In the present embodiment, in the traveling contact formation step, the traveling contact 102 is formed by depositing a metal layer on the front face of the of the bimorph section 108 facing the front face of the substrate 126. In the traveling contact formation step, the metal layer corresponding to the traveling contact 102 is formed on a front face of the second member 130 facing the substrate 126. In the present embodiment, in the traveling contact formation step, the metal layer is formed by the deposition from the rear face of the substrate 126. In addition, the rear face metal layer 116 on the rear face of the substrate 126 is formed by the deposition.

The bimorph switch 100 is manufactured by forming the metallic glass layer and silicon oxide layer corresponding to the bimorph section 108 on the substrate 126, which is a silicon substrate. According to the present embodiment, the bimorph switch manufacturing method, in which a step of bonding a glass substrate and a silicon substrate is not necessary, can be provided. Thereby, the low cost bimorph switch 100 can be provided.

Figure 2:
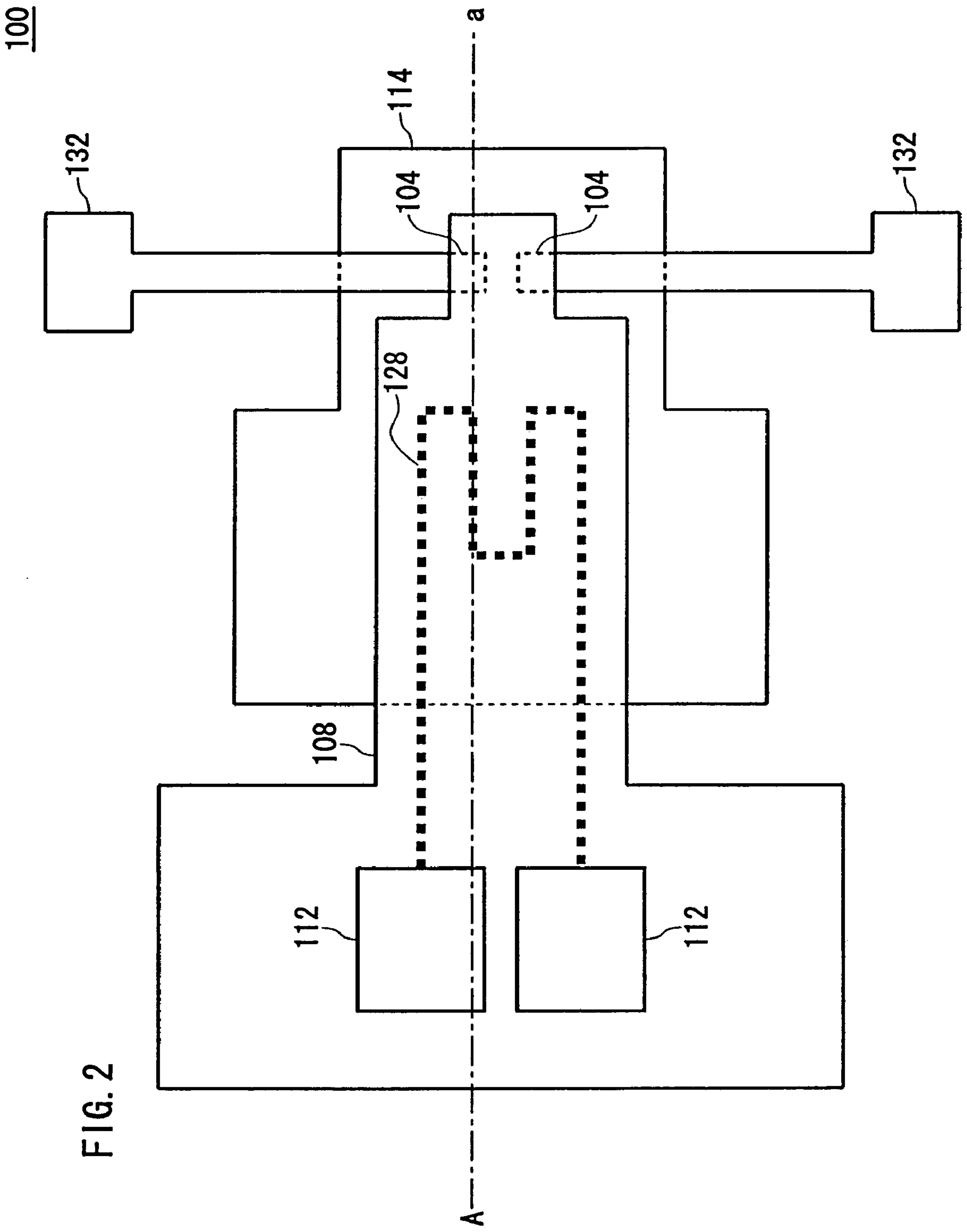
FIG. 2 is a plan view of the bimorph switch according to the present embodiment.

FIG. 2 is a plan view of the bimorph switch 100 according to the present embodiment. In the present embodiment, the bimorph switch 100 includes a plurality of fixed contacts 104. The bimorph switch 100 electrically connects the plurality of fixed contacts 104 with each other by electrically connecting each of the plurality of fixed contacts 104 and the traveling contact 102 explained with reference to FIG. 1. The bimorph switch 100 is a two-contact bimorph switch which connects/disconnect a signal between the plurality of fixed contacts 104. The bimorph switch 100 connects/disconnects a signal between the plurality of fixed contacts 104.

Moreover, the bimorph switch 100 further includes a plurality of fixed contact electrodes 132 corresponding to the plurality of fixed contacts 104. Each of the plurality of fixed contact electrodes 132 is an electrode corresponding to each of the plurality of fixed contacts 104. Each fixed contact electrode 132 electrically connects with the corresponding fixed contact 104. Each fixed contact electrode 132 is integrated with the corresponding fixed contact 104.

Figure 3:
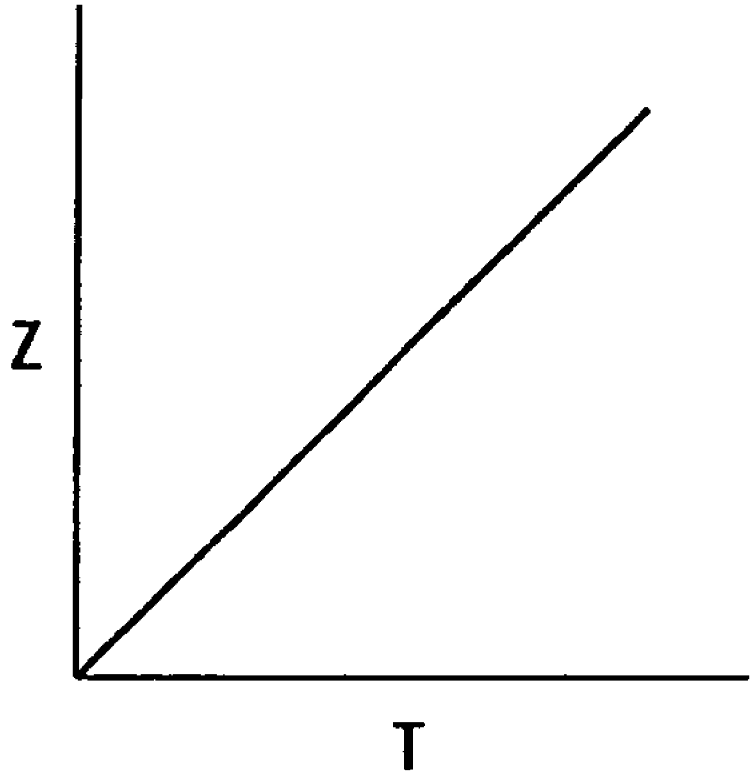
FIG. 3 is a graph showing relation between displacement Z and temperature T explained with reference to FIG. 1.

FIG. 3 is a graph showing relation between displacement Z and temperature T explained with reference to FIG. 1. In the present embodiment, the displacement Z becomes an increasing function to temperature according to the coefficient of thermal expansion of the second member 130 explained with reference to FIG. 1 being larger than the coefficient of thermal expansion of the first member 106 explained in reference to FIG. 1.

That is, when the heater 128 explained with reference to FIG. 1 does not heat the bimorph section 108, the displacement Z becomes smaller than the predetermined value, and the bimorph section 108 electrically connects the traveling contact 102 and the fixed contact 104. On the other hand, when the heater 128 heats the bimorph section 108, the displacement Z increases beyond the predetermined value, and the bimorph section 108 disconnects the traveling contact 102 and the fixed contact 104 electrically.

Figure 4:
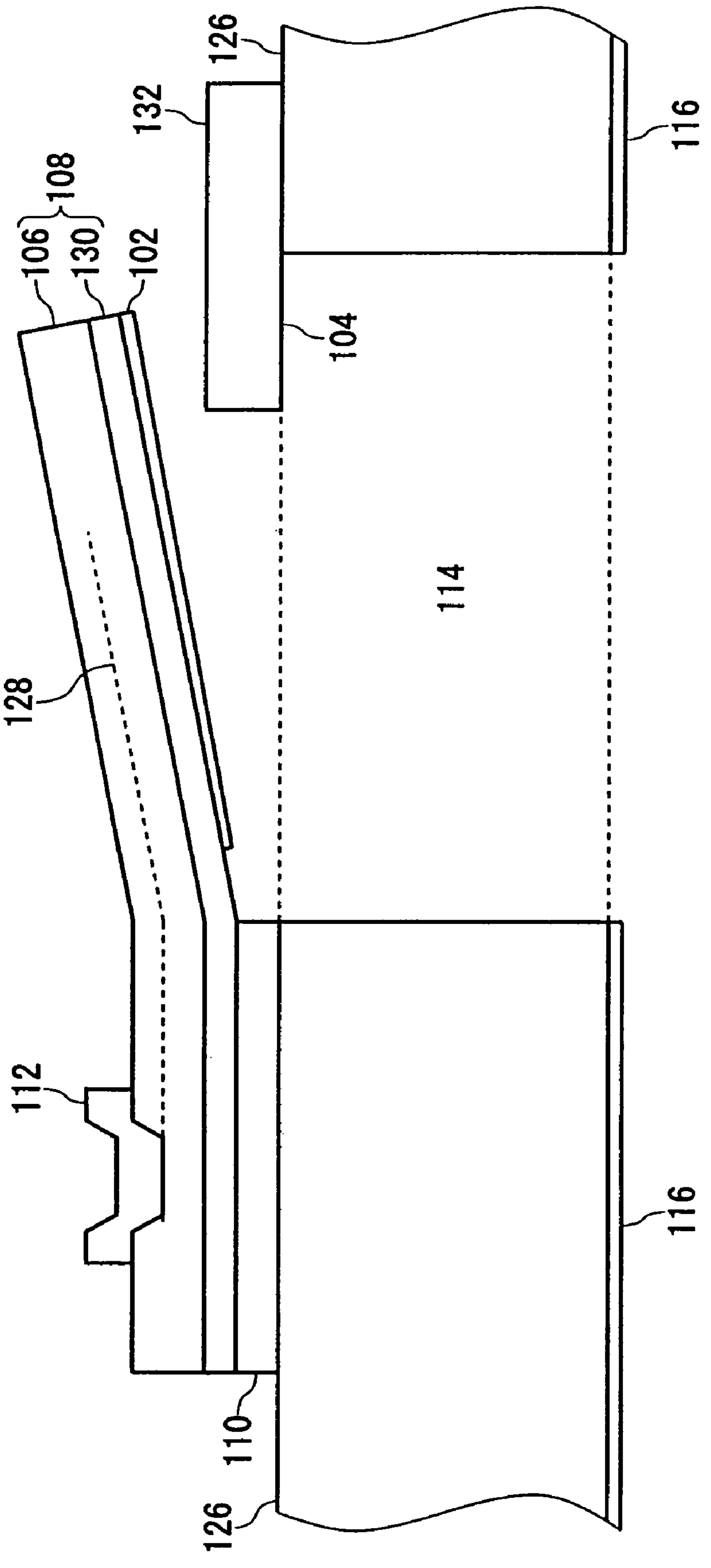
FIG. 4 is a cross sectional view of another example of the bimorph switch according to the present embodiment.

FIG. 4 is a cross sectional view of another example of the bimorph switch 100 according to the present embodiment. In FIG. 4, the component which bears the same reference numeral as FIG. 1 has the same or similar function as/to that of the component in FIG. 1. In this example, the substrate 126 holds the fixed contact electrode 132 in a domain facing the bimorph support layer 110 across the aperture of the through hole 114 on the front face. The fixed contact 104 extends and is formed in the direction towards the bimorph support layer 110 from the fixed contact electrode 132. The fixed contact 104 extends from the vicinity of the aperture of the through hole 114 towards the inside of the aperture. The low cost bimorph switch 100 can be provided also by this example.

Figure 5:
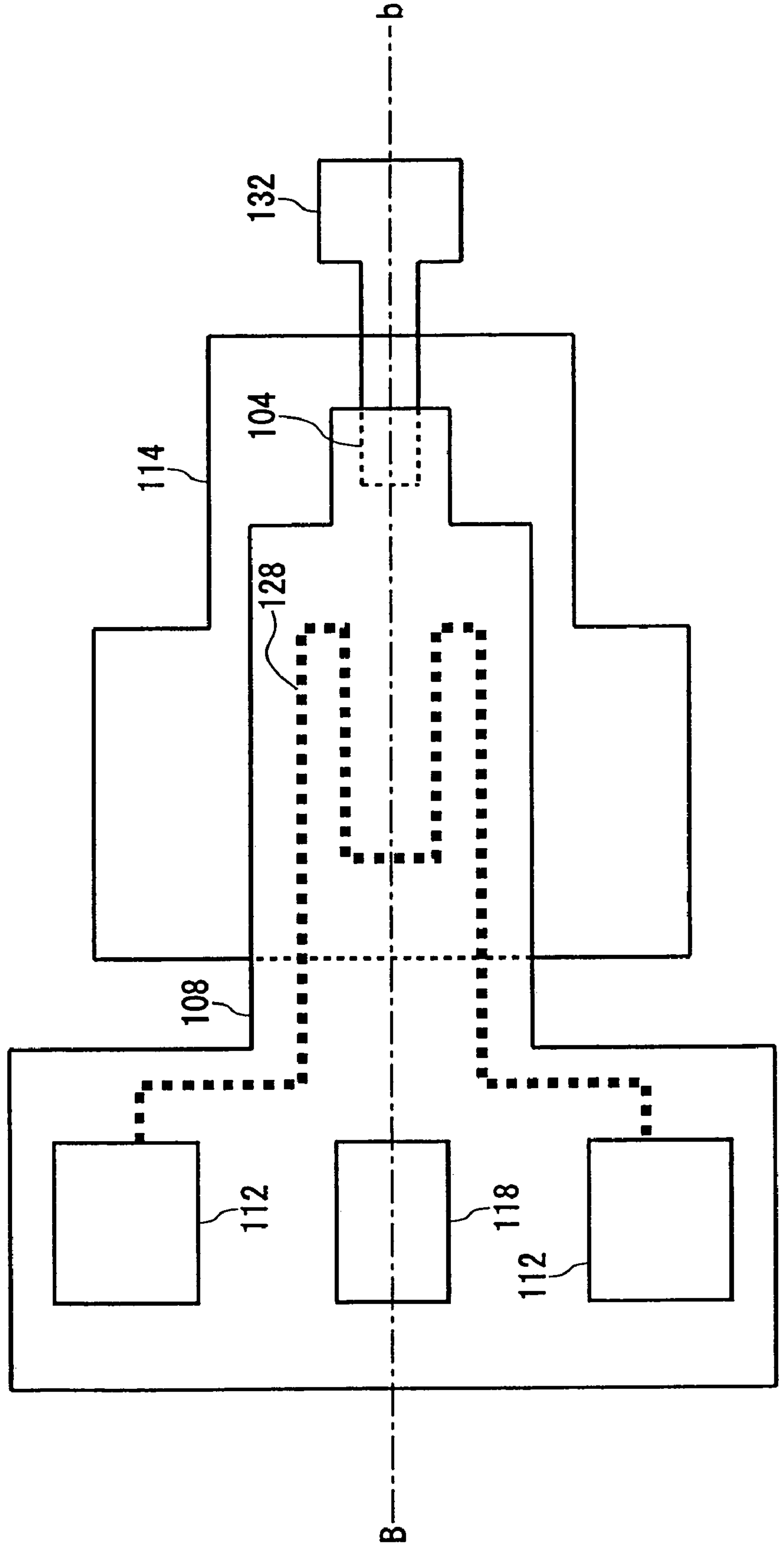
FIG. 5 is a plan view of the bimorph switch according to this example.

FIG. 5 is a plan view of the bimorph switch 100 according to this example. In this example, the bimorph switch 100 is a one-contact bimorph switch which connects/disconnects a signal between the traveling contact 102 and the fixed contact 104 explained with reference to FIG. 4. The bimorph switch 100 further includes a traveling contact electrode 118. The traveling contact electrode 118 is an electrode electrically connects with the traveling contact 102.

Figure 6:
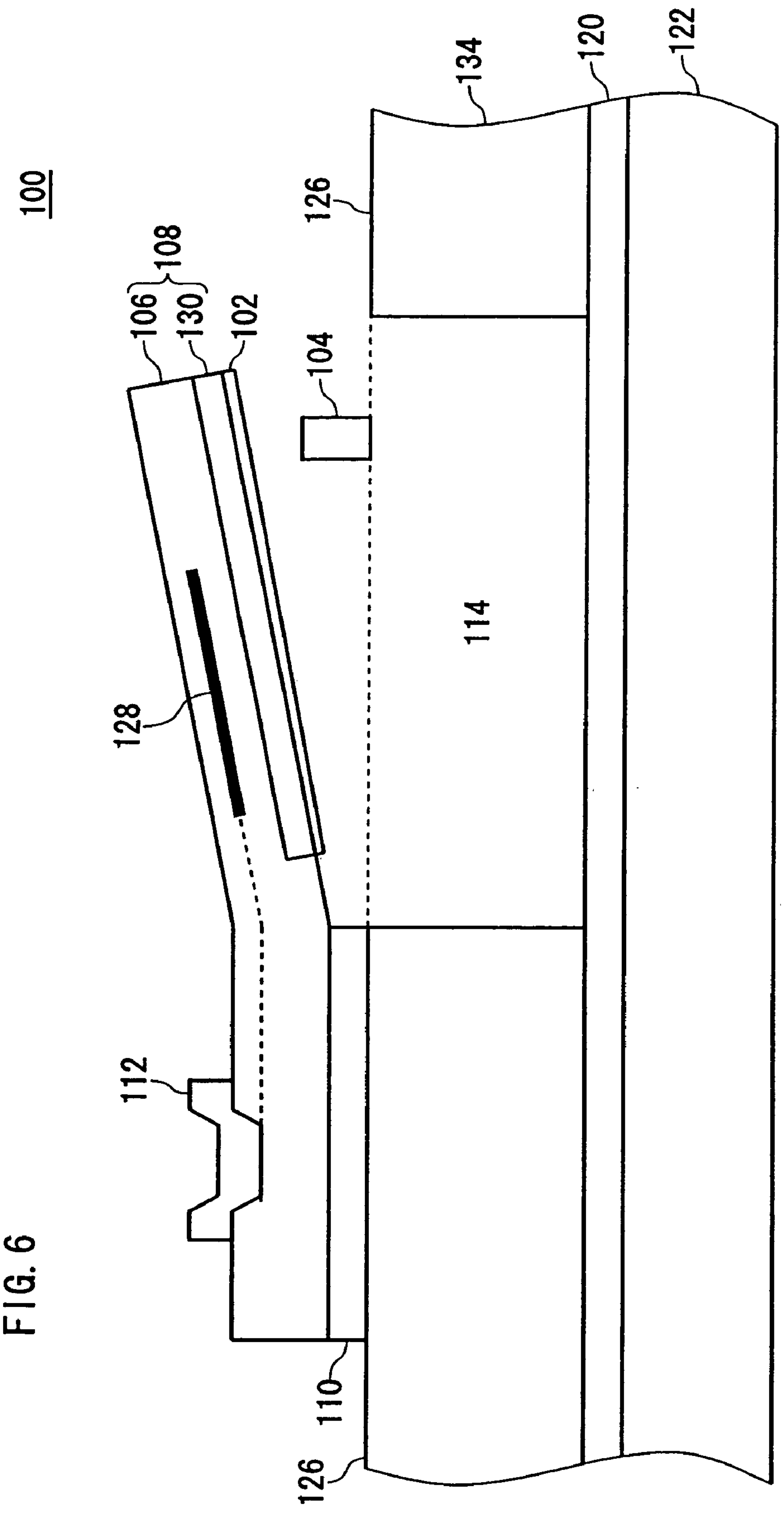
FIG. 6 is a cross sectional view of another example of the bimorph switch according to the present embodiment.

FIG. 6 is a cross sectional view of another example of the bimorph switch 100 according to the present embodiment. In FIG. 6, the component which bears the same reference numeral as FIG. 1 has the same or similar function as/to that of the configuration in FIG. 1. In this example, the substrate 126 is an SOI substrate. The substrate 126 includes a lower layer 122, an insulating layer 120, and an upper layer 134. In this example, the lower layer 122 is a silicon substrate holding the insulating layer 120 and the upper layer 134. The insulating layer 120 is a silicon oxide film formed on the front face of the lower layer 122. The upper layer 134 is a silicon substrate which faces the lower layer 122 sandwiching the insulating layer 120 therebetween. The upper layer 134 includes a through hole 114.

In this example, the traveling contact 102 is formed by sputtering a gold (Au) alloy from oblique direction with respect to the front face of the substrate 126. The layer of the gold (Au) alloy formed on the front face of the substrate 126 by the sputtering is removed by ion milling from the front side of the substrate 126. The low cost bimorph switch 100 can be also provided by this example.

Figure 7:
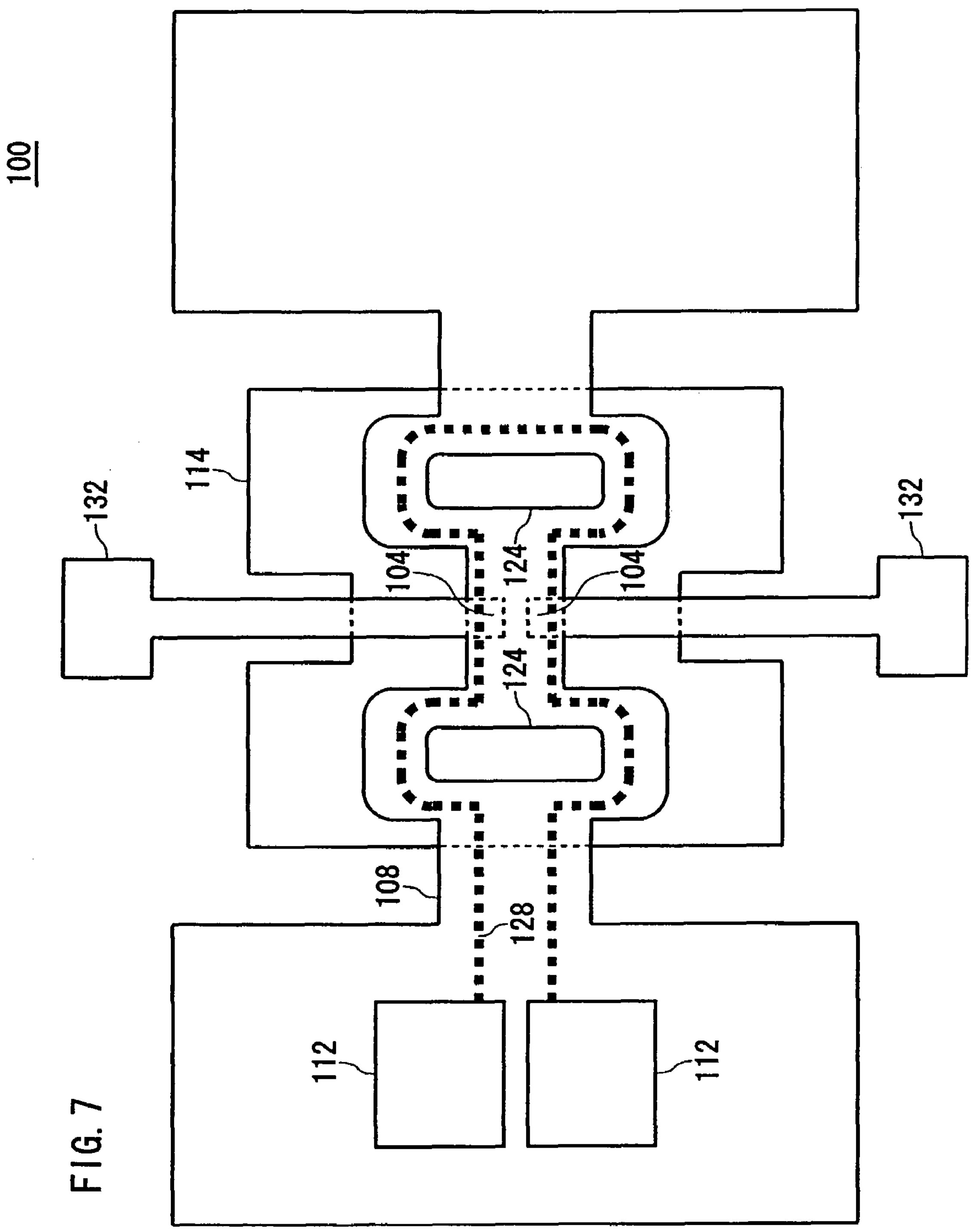
FIG. 7 is a plan view of another example of the bimorph switch according to the present embodiment.

FIG. 7 is a plan view of another example of the bimorph switch 100 according to the present embodiment. In FIG. 7, the component which bears the same reference numeral as FIG. 1 has the same or similar function as/to that of the component in FIG. 1. In this example, the bimorph switch 100 is a doubly supported beam switch. The bimorph section 108 holds the traveling contact 102 at substantially the center section of its front face of the bimorph section 108 facing the substrate 126. The bimorph section 108 includes a first end, a second end, and a plurality of apertures 124. The first end and the second end of the bimorph section 108 are fixed to the substrate 126 explained with reference to FIG. 1. In this case, the first end and the second end are formed on the bimorph support layer 110 which is explained with reference to FIG. 1. The bimorph support layer 110 supports the first end and the second end of the bimorph section 108.

In this example, the apertures 124 are through holes which penetrate the bimorph section 108. The apertures 124 penetrate from a front face of the bimorph section 108 facing the substrate 126 to its rear face. The apertures 124 reduce bending stress caused in the bimorph section 108 when the bimorph section 108 drives the traveling contact 102. Thereby, also even when heating value of a heater 128 is small, the bimorph section 108 can fully be deformed. Therefore, according to this example, the power saving heater 128 can be used.

Also in this example, the bimorph switch 100 is manufactured by forming the metallic glass layer and silicon oxide layer corresponding to the bimorph section 108 on the substrate 126, which is a silicon substrate. The low cost bimorph switch 100 can be also provided by this example. In another example, the apertures 124 may be recesses provided on the front face of the bimorph section 108. The apertures 124 may be holes hollowed in the direction substantially parallel to the front face of the substrate 126.

Figure 8:
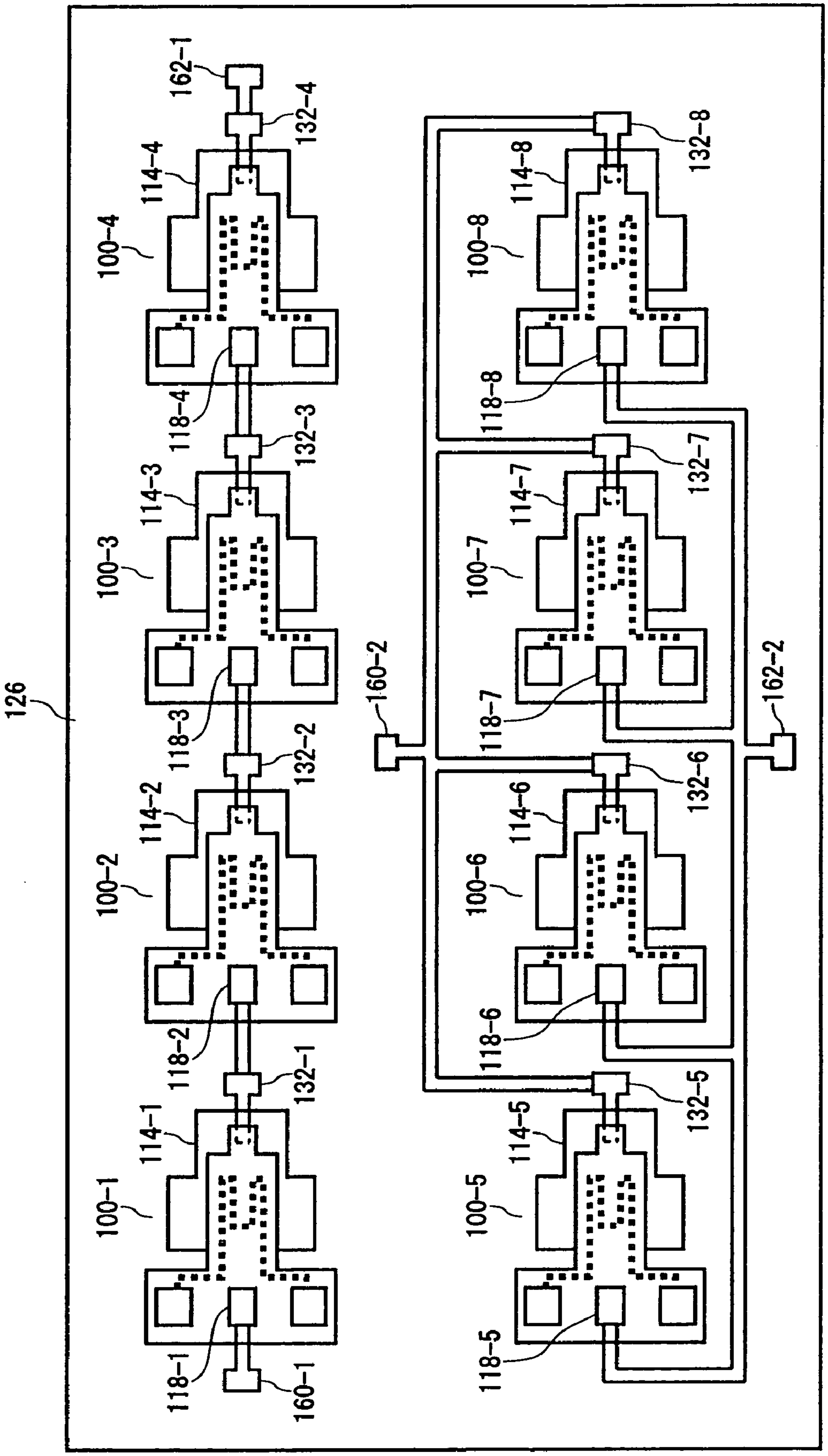
FIG. 8 shows an exemplary switch array according to a second embodiment of the present invention.

FIG. 8 shows an exemplary switch array 136 according to a second embodiment of the present invention. The switch array 136 is an example of an integration switch. The switch array 136 includes a substrate 126 and a plurality of bimorph switches (100-1 to 100-8) formed on the substrate 126. The switch array 136 further includes a plurality of first terminals (160-1, 160-2) and a plurality of second terminals (162-1, 162-2).

In the present embodiment, as for the switch array 136, each of the plurality of bimorph switches (100-1 to 100-8) may have the same or similar function as/to that of the bimorph switch 100 explained with reference to FIG. 4. In another example, each of the plurality of bimorph switches (100-1 to 100-8) may have the same or similar function as/to that of the bimorph switch 100 explained with reference to FIG. 1. A plurality of through holes (114-1 to 114-8), a plurality of traveling contact electrodes (118-1 to 118-8), and a plurality of fixed contact electrodes (132-1 to 132-8) respectively corresponding to the plurality of bimorph switches (100-1 to 100-8) are included.

In the present embodiment, the traveling contact electrode 118-1 electrically connects with the first terminal 160-1. The traveling contact electrode 118-2 electrically connects with the fixed contact electrode 132-1. The traveling contact electrode 118-3 electrically connects with the fixed contact electrode 132-2. The traveling contact electrode 118-4 electrically connects with the fixed contact electrode 132-3. Moreover, the fixed contact electrode 132-4 electrically connects with the second terminal 162-1. Thereby, the first terminal 160-1 electrically connects with the second terminal 162-1 when all of the plurality of bimorph switches (100-1 to 100-4) is turned on.

Moreover, the first terminal 160-2 electrically connects with the plurality of fixed contact electrodes (132-5 to 132-8). The second terminal 162-2 electrically connects with the plurality of traveling contact electrodes (118-5 to 118-8). Thereby, the first terminal 160-1 electrically connects with the second terminal 162-1 when either of the plurality of bimorph switches (100-1 to 100-4) is turned on.

In addition, each of the plurality of first terminals (160-1, 160-2), the plurality of second terminals (162-1, 162-2), the plurality of traveling contact electrodes (118-1 to 118-8), and the plurality of fixed contact electrodes (132-1 to 132-8) may be electrically connected by wiring formed on the substrate 126. In another example, each of the plurality of first terminals (160-1, 160-2), the plurality of second terminals (162-1, 162-2), the plurality of traveling contact electrodes (118-1 to 118-8), and the plurality of the fixed contact electrodes (132-1 to 132-8) may be electrically connected by wire bonding.

The plurality of bimorph switches (100-1 to 100-8) are manufactured with low cost like the bimorph switch 100 explained with reference to FIG. 4. Therefore, according to the present embodiment, the low cost switch array 136 can be provided. In another example, the integration switch according to the present embodiment may include one or more bimorph switches 100 and elements, such as a transistor, a resistor, and a capacitor, on the substrate 126.

Figure 9:
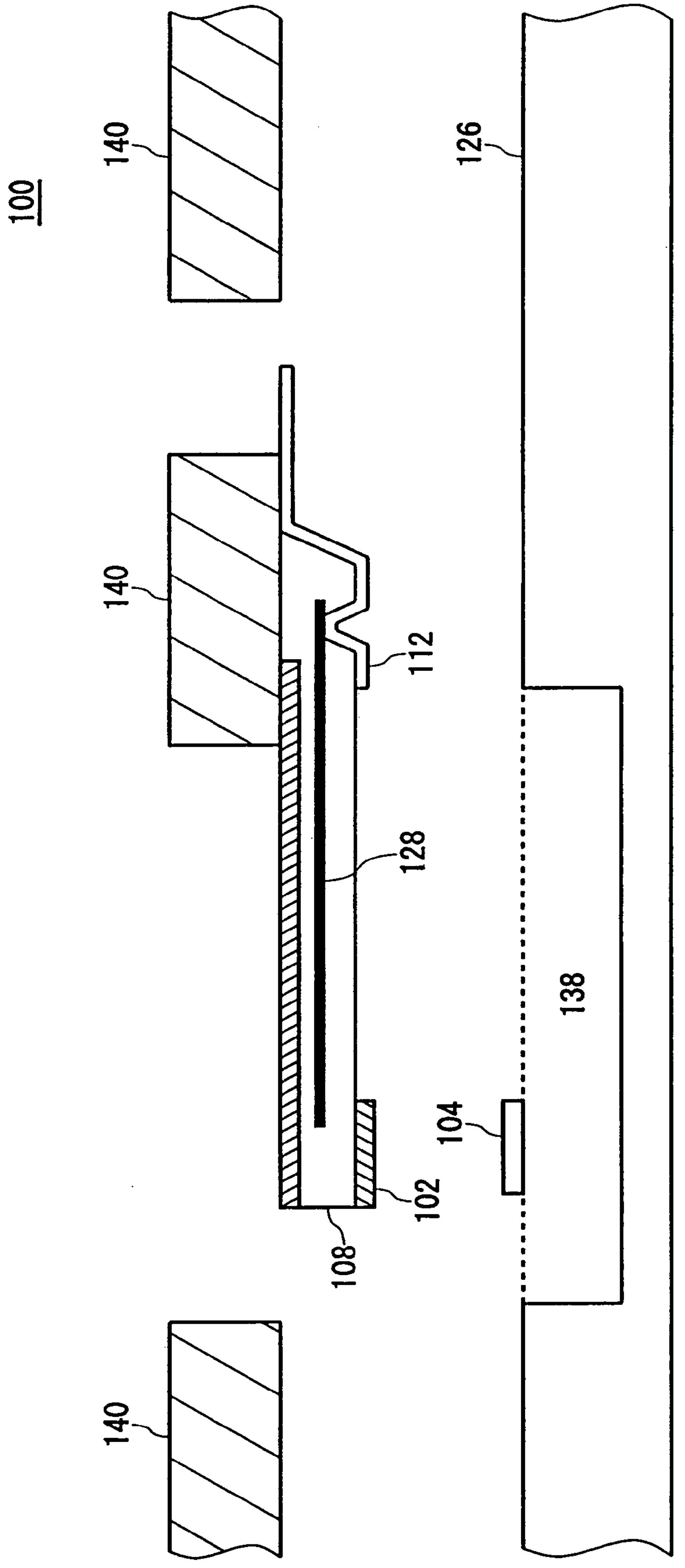
FIG. 9 is a cross sectional view of an exemplary bimorph switch according to a third embodiment of the present invention.

FIG. 9 is a cross sectional view of an exemplary bimorph switch 100 according to a third embodiment of the present invention. In FIG. 9, the component which bears the same reference numeral as FIG. 1 has the same or similar function as/to that of the component in FIG. 1. In the present embodiment, the bimorph switch 100 includes a traveling contact 102, a fixed contact 104, a bimorph section 108, a substrate 126, and a support substrate 140. The bimorph switch 100 is a bimorph switch which connects the traveling contact 102 and the fixed contact 104 electrically.

In the present embodiment, the support substrate 140 holds the bimorph section 108. The support substrate 140 holds the second end corresponding to the first end at which the bimorph section 108 holds the traveling contact 102 of the bimorph section 108. The support substrate 140 may be a silicon substrate.

The substrate 126 holding the fixed contact 104 may be a glass substrate. The substrate 126 includes a hollow section 138. In the present embodiment, the hollow section 138 is a recess having an aperture on the front face of the substrate 126 facing the bimorph section 108. In another example, the hollow section 138 may be a through hole having an aperture on the front face of the substrate 126 facing the bimorph section 108. In the present embodiment, the hollow section 138 is formed by etching. In another example, the hollow section 138 may be formed by machining.

FIGS. 10A-10I are drawings explaining operation of the bimorph switch 100 according to the present embodiment. The bimorph section 108 connects the traveling contact 102 and the fixed contact 104 electrically by driving the traveling contact 102. The bimorph section 108 makes the traveling contact 102 to be pressed to the fixed contact 104 by driving the traveling contact 102. In the present embodiment, the fixed contact 104 includes a fixed section 142 and a deformed section 144. The fixed section 142 and the deformed section 144 are integrally formed. The fixed section 142 is formed in the vicinity of the hollow section 138 on a front face of the substrate 126 facing the bimorph section 108. The fixed section 142 is fixed to the substrate 126.

The deformed section 144 extends and is formed from the fixed section 142. The deformed section 144 extends and is formed from an edge of the aperture of the hollow section 138 towards inside of the aperture. The deformed section 144 is resiliently deformed in the direction of the pressing when being pressed by the traveling contact 102.

Figure 10A:
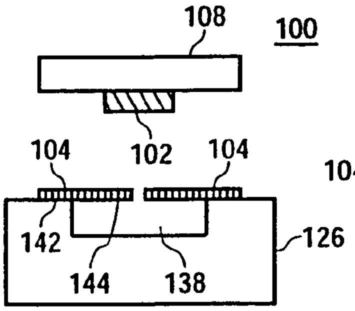

FIG. 10A shows the bimorph switch 100 in a case where the bimorph section 108 holds the traveling contact 102 without contacting the traveling contact 102 and the fixed contact 104. In this case, the deformed sections 144 extend from the fixed sections 142 substantially parallel with the front face of the bimorph section 108. In addition, in the present embodiment, the bimorph switch 100 includes a plurality of fixed contacts 104.

Figure 10B:
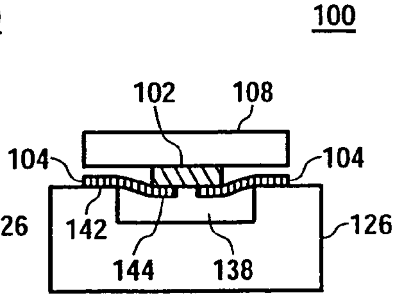

FIG. 10B shows the bimorph switch 100 when the bimorph section 108 contacts the traveling contact 102 and the fixed contact 104.

The bimorph section 108 electrically connects the plurality of fixed contacts 104 with each other by connecting the traveling contact 102 to each of the plurality of fixed contacts 104 electrically. In this case, the deformed sections 144 are deformed in the direction of the traveling contact 102 pressing the fixed contacts 104. The hollow section 138 holds edges of the deformed sections 144. By this, sticking caused by the traveling contact 102 pressing the fixed contacts 104 can be prevented. Thereby, the traveling contact 102 can perform stable contact with the fixed contact 104. According to the present embodiment, the bimorph switch having the stable contact can be provided.

Figure 10C:
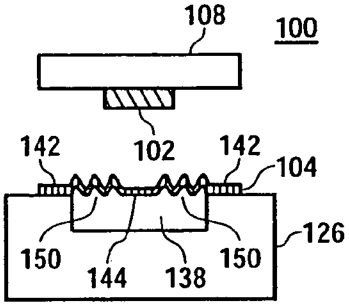

FIG. 10C shows the bimorph switch 100 in a case where the bimorph section 108 holds the traveling contact 102 without contacting the traveling contact 102 and the fixed contact 104 in another example. The fixed contact 104 crosses the aperture of the hollow section 138. In this example, the fixed contact 104 includes a plurality of fixed sections 142 corresponding to a first end and a second end of the fixed contact 104. The deformed section 144 connects one of the fixed sections 142 and the other fixed section 142. The first end of the deformed section 144 may connects with the former one of the fixed sections 142, and the second end of the deformed section 144 may connects with the latter one of the fixed sections 142.

Moreover, in this example, the deformed section 144 includes corrugated sections 150 having corrugated structures. The corrugated sections 150 may be rib-like objects expanded and contracted when it is pressed. The corrugated sections 150 may have shapes of corrugated beams. In another example, the fixed contact 104 may include a corrugated structure over the whole deformed section 144. The fixed contact 104 may further include a corrugated structure over the whole fixed section 142.

Figure 10D:
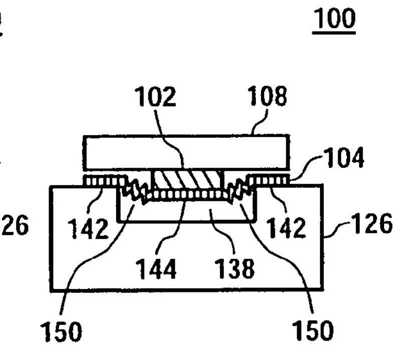

FIG. 10D shows the bimorph switch 100 when the bimorph section 108 contacts the traveling contact 102 and the fixed contact 104 in this example. In this example, when the corrugated sections 150 expand, the deformed section 144 deforms in a direction where the traveling contact 102 presses the fixed contact 104. The hollow section 138 holds a central part of the deformed section 144.

Figure 10E:
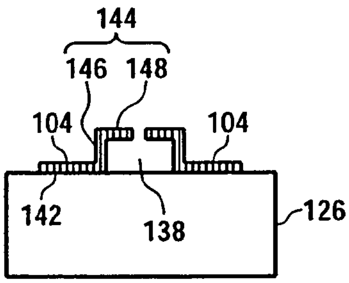

FIG. 10E shows another example of the fixed contact 104 according to the present embodiment. In this example, the deformed sections 144 include extending sections 146 and contact sections 148. The extending sections 146 extend from the fixed sections 142 substantially parallel with a pressing direction where the traveling contact 102 presses the fixed contacts 104. The contact sections 148 extend from the extending sections 146 substantially parallel with a front face of the substrate 126 facing the bimorph section 108, and contacts the traveling contact 102. In this case, the bimorph switch 100 includes a hollow section 138 in a domain between the front face of the substrate 126 and the contact sections 148.

Figure 10F:
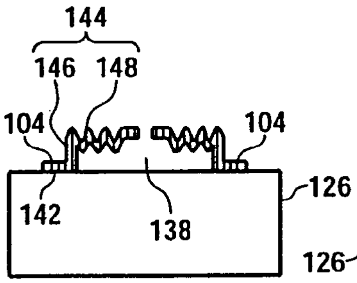

FIG. 10F shows another example of the fixed contacts 104 according to the present embodiment. In this example, the contact sections 148 include corrugated structures in part. In another example, the contact sections 148 may include corrugated structures in the whole.

Figure 10G:
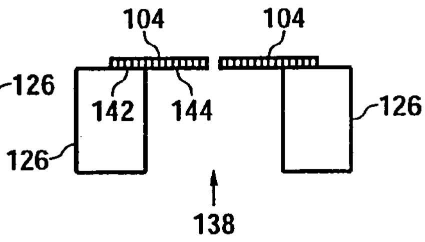

FIG. 10G shows another example of the fixed contacts 104 according to the present embodiment. In this example, the bimorph switch 100 includes a hollow section 138, which is a through hole formed from the front face to the rear face of the substrate 126. The fixed contacts 104 extend from the vicinity of the aperture of the through hole towards inside of the aperture.

Figure 10H:
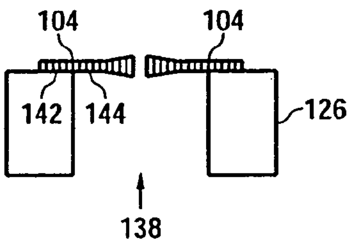

FIG. 10H shows another example of the fixed contacts 104 according to the present embodiment. In this example, thickness of the fixed contact 104 increases gradually to sides of the deformed sections 144 from sides of the fixed sections 142. Also in this case, by the fixed contact 104 deforming in the direction where the traveling contact 102 presses the fixed contact 104, the traveling contact 102 can perform stable contact with the fixed contacts 104. That is, according to the present embodiment, even if it is the case where the fixed contacts 104 has uneven thickness, the traveling contact 102 can perform stable contact with the fixed contacts 104.

Figure 10I:
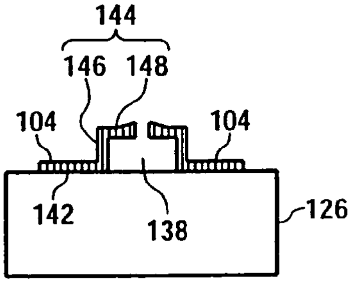

FIG. 10I shows another example of the fixed contacts 104 according to the present embodiment. In this example, thickness of the contact sections 148 increases gradually towards the direction away from the extending sections 146. Also in this case, by the fixed contacts 104 deforming in the direction where the traveling contact 102 presses the fixed contact 104, the traveling contact 102 can perform stable contact with the fixed contact 104.

Figure 11:
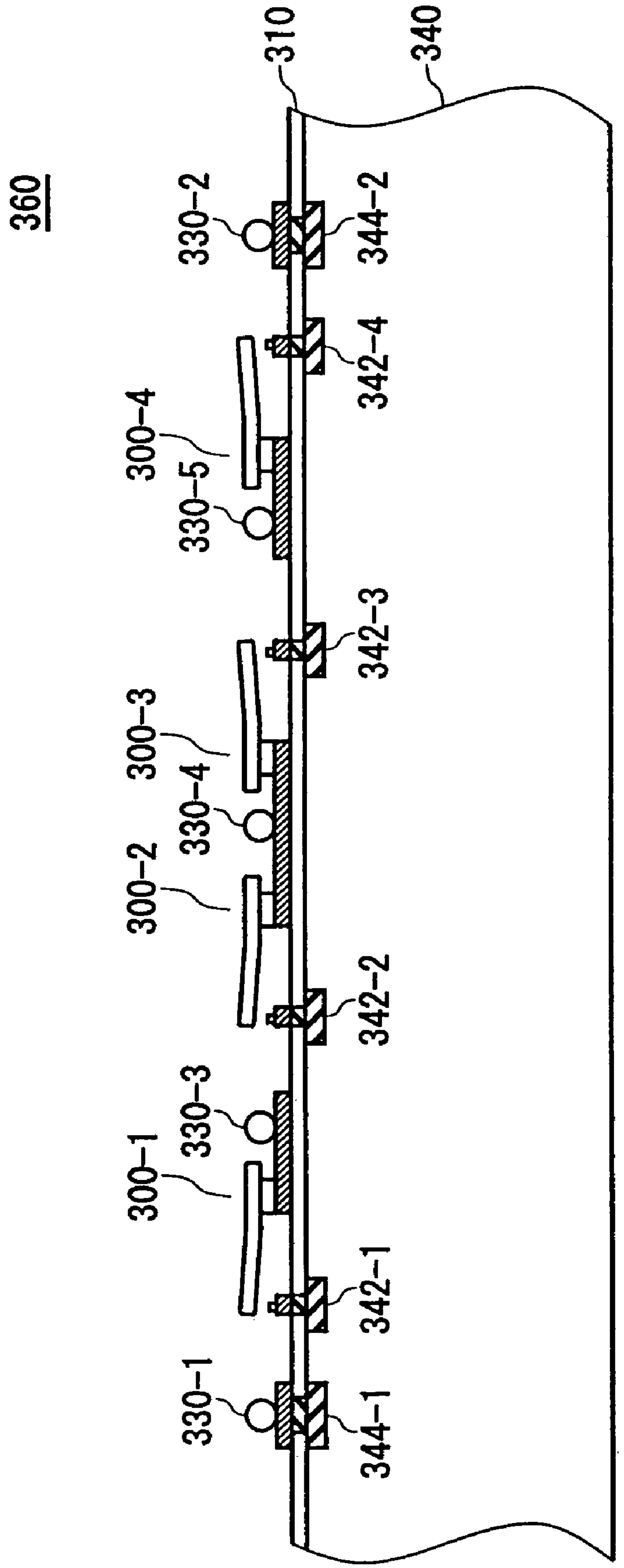
FIG. 11 shows an exemplary electronic circuitry according to a fourth embodiment of the present invention.

FIG. 11 shows an exemplary electronic circuitry 360 according to a fourth embodiment of the present invention. The electronic circuitry 360 is an electronic circuitry formed on a semiconductor substrate 340. The electronic circuitry 360 includes an integrated circuit (not shown) formed on the semiconductor substrate 340, and a plurality of bimorph switches (300-1 to 300-4), which are examples of mechanical switches. In addition, the semiconductor substrate 340 is an example of the substrate on which the integrated circuit is formed.

The electronic circuitry 360 further includes a switch substrate 310 and a plurality of bumps (330-1 to 330-5). The plurality of bimorph switches (300-1 to 300-4) are mounted on the switch substrate 310. The plurality of bimorph switches (300-1 to 300-4) are mounted over the semiconductor substrate 340 across the switch substrate 310.

The switch substrate 310 is a substrate which is mounted on the semiconductor substrate 340 and holds the plurality of bimorph switches (300-1 to 300-4). The switch substrate 310 includes a plurality of wirings (342-1 to 342-4, 344-1, 344-2).

The plurality of wirings (342-1 to 342-4, 344-1, 344-2) are wirings penetrates from a front face facing the semiconductor substrate 340 of the switch substrate 310 to its rear face. Each of the plurality of wiring (342-1 to 342-4, 344-1, 344-2) electrically connects with the integrated circuit formed on the semiconductor substrate 340.

The plurality of bumps (330-1 to 330-5) are bumps formed of metal.

The plurality of bumps (330-1 to 330-5) may be formed of gold (Au). Each of the plurality of bumps (330-1 to 330-5) is mounted on the switch substrate 310, and it electrically connects with the power supply which supplies electric power to the electronic circuitry 360. Each of the bump 330-1 and the bump 330-2 electrically connects with the power supply which supplies electric power to the integrated circuit. Each of the bump 330-1 and the bump 330-2 electrically connects with the integrated circuit through each of the wiring 344-1 and the wiring 344-2.

The plurality of bumps (330-3 to 330-5) electrically connect with the power supply which supplies electric power to the plurality of bimorph switches (300-1 to 300-4). The bump 330-3 electrically connects with a heater included in the bimorph switch 300-1. The bump 330-4 electrically connects with a heater included in each of the plurality of bimorph switches (300-2, 300-3). The bump 330-5 electrically connects with a heater included in the bimorph switch 300-4. In another example, each of the plurality of bumps (330-1 to 330-5) may electrically connect with another electronic circuitry. Each of the plurality of bumps (330-1 to 330-5) may electrically connect with the integrated circuit formed on another semiconductor substrate.

An example of an electronic circuitry manufacturing method for manufacturing the electronic circuitry 360 according to the present embodiment will be explained hereinafter. The electronic circuitry which includes a bimorph switch and an integrated circuit is manufactured by the electronic circuitry manufacturing method. The electronic circuitry manufacturing method includes a preparation step, an integrated circuit formation step, a switch formation step, and a mounting step.

In the preparation step, the semiconductor substrate 340 and the switch substrate 310 are prepared. In the integrated circuit formation step, an integrated circuit is formed on the semiconductor substrate 340. In the switch formation step, the bimorph switches 300 are formed. In the switch formation step, the bimorph switches 300 are formed on the switch substrate 310. In the mounting step, the bimorph switches 300 are mounted on the semiconductor substrate 340. In the mounting step, the bimorph switches 300 are mounted on the semiconductor substrate 340 by mounting the switch substrate 310 on the semiconductor substrate 340.

Figures 12A, 12B, 12C:
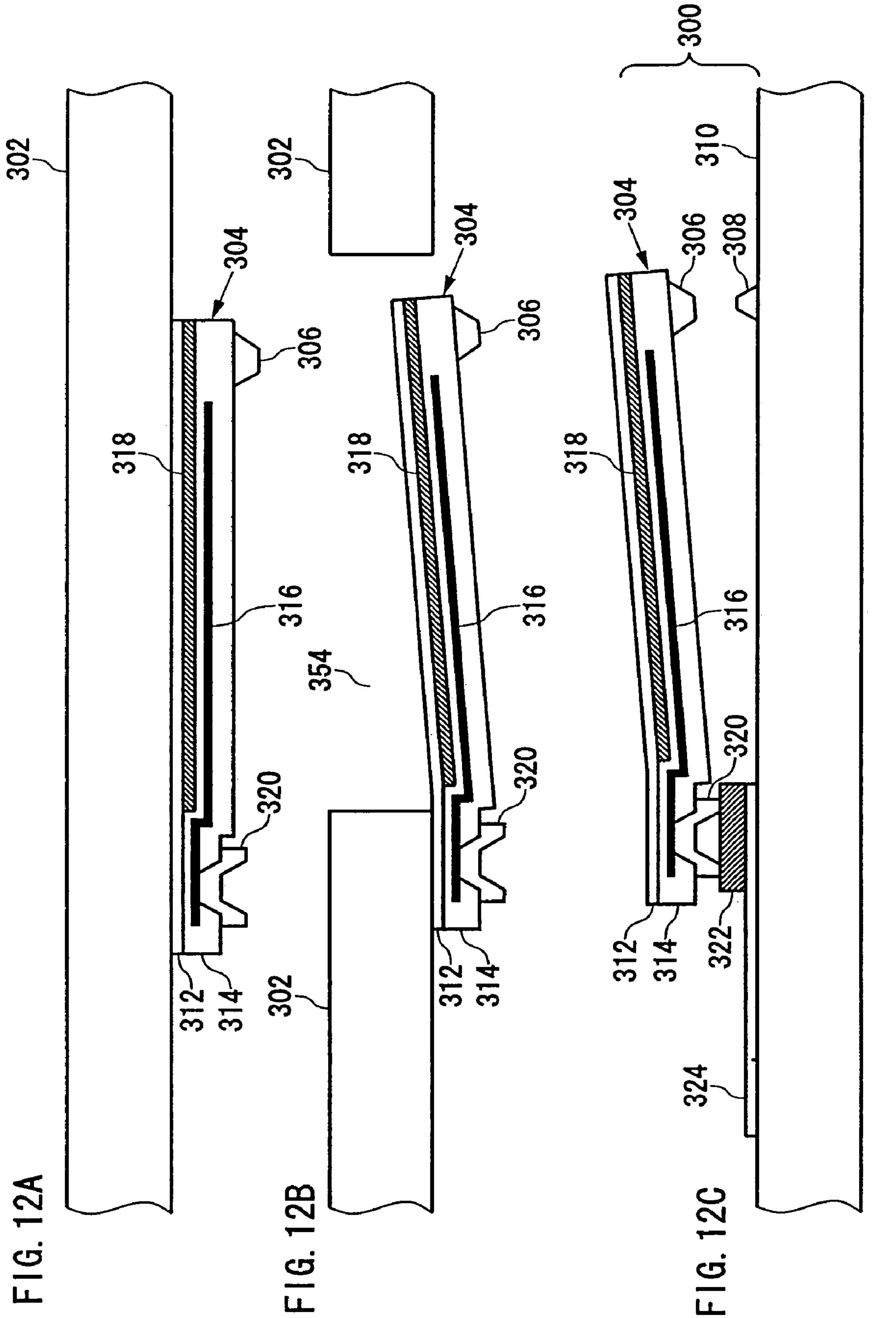

FIGS. 12A-12C are drawings explaining exemplary switch formation steps according to the present embodiment. In the switch formation step, the bimorph switch 300 is formed on the switch substrate 310. The bimorph switch 300 includes a traveling contact 306, a fixed contact 308, a bimorph section 304, a heater electrode wiring 324, and a bimorph support section 322. The bimorph section 304 drives the traveling contact 306. The bimorph section 304 connects the traveling contact 306 and the fixed contact 308 electrically by driving the traveling contact 306. The bimorph section 304 includes a first member 314, a second member 318, a poly silicon layer 312, a heater 316, and a heater electrode 320.

The first member 314 is a low expansion member of the bimorph section 304. The first member 314 is formed of silicon oxide. The second member 318 is a high expansion member of the bimorph section 304. The second member 318 is formed of metal. The second member 318 is formed on a rear face of the front face of the first member 314 facing the switch substrate 310. The second member 318 is formed on a part of the rear face. The poly silicon layer 312 is a layer which covers a rear face of the front face of the second member 318 facing the first member 314.

The heater 316 is a heater which heats the bimorph section 304. The heater 316 is formed in the interior of the first member 314. Moreover, the heater electrode 320 is a metal electrode electrically connecting with the heater 316. In the present embodiment, the heater electrode 320 is formed of gold (Au).

The heater electrode wiring 324 is wiring which is formed on the front face of the switch substrate 310 and electrically connects with the heater electrode 320. The bimorph support section 322 is inserted and formed between the heater electrode 320 and the heater electrode wiring 324, and supports the bimorph section 304. The bimorph section 304 further connects the heater electrode 320 and the heater electrode wiring 324 electrically. The bimorph support section 322 is formed of metal. In the present embodiment, the bimorph support section 322 is formed of gold (Au). The bimorph support section 322 may be a bump formed of metal. In addition, in the present embodiment, the switch formation step includes a bimorph section formation step, a bonding step, and a removal step.

FIG. 12A is a drawing explaining the bimorph section formation step.

In the bimorph section formation step, the bimorph section 304 is formed on the front face of the sacrificial substrate 302. The bimorph section formation step includes a poly silicon layer formation step, a second member formation step, a first member formation step, a traveling contact formation step, and a heater electrode formation step.

In the poly silicon layer formation step, the poly silicon layer 312 is formed at a predetermined poly silicon layer formation domain on the front face of the sacrificial substrate 302. In the second member formation step, the second member 318 is formed on a rear face of the front face of the poly silicon layer 312 facing the sacrificial substrate 302. In the second member formation step, the second member 318 is formed on a part of the rear face.

In the first member formation step, the first member 314 and the heater 316 are formed. In the first member formation step, the first member 314 is formed on a rear face of the front face of the second member 318 facing the poly silicon layer 312. In the first member formation step, the first member 314 which covers the rear face is formed.

In the first member formation step, a first layer covering the rear face, and a second layer facing the second member 318 across the first layer are formed as the first member 314. In the first member formation step, the heater 316 is inserted between the first layer and the second layer. In the first member formation step, the first layer and the second layer are formed of silicon oxide. In the first member formation step, the first layer and the second layer may be formed by CVD.

In the traveling contact formation step, the traveling contact 306 is formed on a rear face of the front face of the first member 314 facing the second member 318. In the traveling contact formation step, the traveling contact 306 is formed of metal. In the traveling contact formation step, the traveling contact 306 is formed in the vicinity of a first end of the bimorph section 304.

In the heater electrode formation step, the heater electrode 320 is formed on a rear face of the front face of the first member 314 facing the second member 318. In the heater electrode formation step, the heater electrode 320 is formed in the vicinity of a second end of the bimorph section 304 corresponding to the first end at which the traveling contact 306 is formed.

FIG. 12B is a drawing explaining a bonding step. The bonding step includes a through hole formation step and a bonding step. In the through hole formation step, the through hole 354 is formed penetrating from a front face of the sacrificial substrate 302 facing the bimorph section 304 to its rear face. The through hole 354 accommodates apart of the first end holding the traveling contact 306 of the bimorph section 304 when the bimorph section 304 deforms. The second end corresponding to the first end of the bimorph section 304 is held in the vicinity of an aperture of the through hole 354 on the front face of the sacrificial substrate 302.

In the present embodiment, in the second member formation step and the first member formation step which have been explained with reference to FIG. 12A, the second member 318 and the first member 314 are formed in high temperature atmosphere. Therefore, in normal temperature, the bimorph section 304 deforms the first end holding the traveling contact 306 in the direction towards the interior of the through hole 354.

In another example, the through hole formation step may further include a cooling step. In the cooling step, the bimorph section 304 is made to be deformed in the above-mentioned direction by cooling the bimorph section 304.

In the bonding step, the bimorph section 304 and the switch substrate 310 are bonded. In the bonding step, the heater electrode 320 of the bimorph section 304, and the bimorph support section 322 formed on the front face of the switch substrate 310 are bonded across the heater electrode wiring 324. In the bonding step, thermocompression bonding of the heater electrode 320 formed of gold (Au) and the bimorph support section 322 formed of gold (Au) is carried out. In another example, the bonding step may follow the switch formation step.

FIG. 12C is a drawing explaining the removal step. In the removal step, the sacrificial substrate 302 is removed. In the removal step, the sacrificial substrate 302 may be removed by ICP etching, for example.

Figure 13:
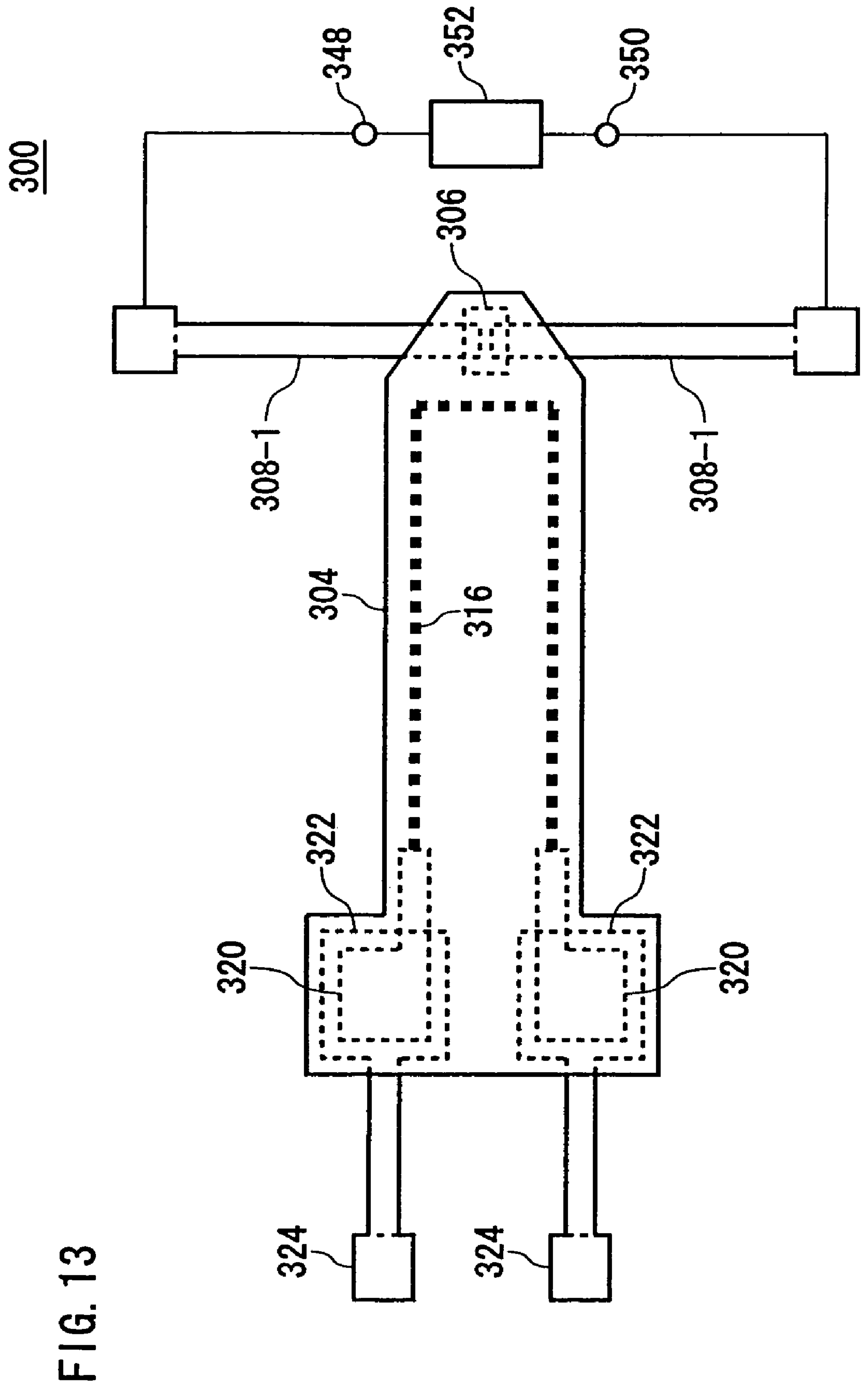
FIG. 13 is a plan view of the bimorph switch according to the present embodiment.

FIG. 13 is a plan view of the bimorph switch 300 according to the present embodiment. In the present embodiment, the integrated circuit 352 formed on the semiconductor substrate 340 explained with reference to FIG. 11 includes a first terminal 348 and a second terminal 350. The bimorph switch 300 includes a fixed contact 308-1 electrically connecting with the first terminal 348, and a second terminal 350 electrically connecting with the second terminal 350.

The bimorph switch 300 electrically connects a plurality of fixed contacts (308-1, 308-2) with each other by electrically connecting each of the plurality of fixed contacts (308-1, 308-2) and the traveling contact 306. That is, the bimorph switch 300 connects the first terminal 348 and the second terminal 350 electrically by electrically connecting the traveling contact 306 and each of the plurality of fixed contacts (308-1, 308-2).

In addition, in the present embodiment, the integrated circuit 352 includes a semiconductor switch (not shown). The bimorph switch 300 has an off leakage current less than that of the semiconductor switch. The bimorph switch 300 switches greater current than that of the semiconductor switch. The bimorph switch 300 switches the signal of frequency higher than that of the semiconductor switch.

In the present embodiment, the electronic circuitry 360 explained with reference to FIG. 11 includes a bimorph switch 300, which is a mechanical switch with off leakage current being smaller than that of the semiconductor switch. Therefore, according to the present embodiment, an electronic circuitry of low power consumption can be provided. Furthermore, the electronic circuitry which includes a switch, which switches greater current than current to be switched by the semiconductor switch, can be provided. The electronic circuitry, which includes the switch which switches the signal of frequency higher than the signal to be switched by the semiconductor switch, can be provided.

Figure 14:
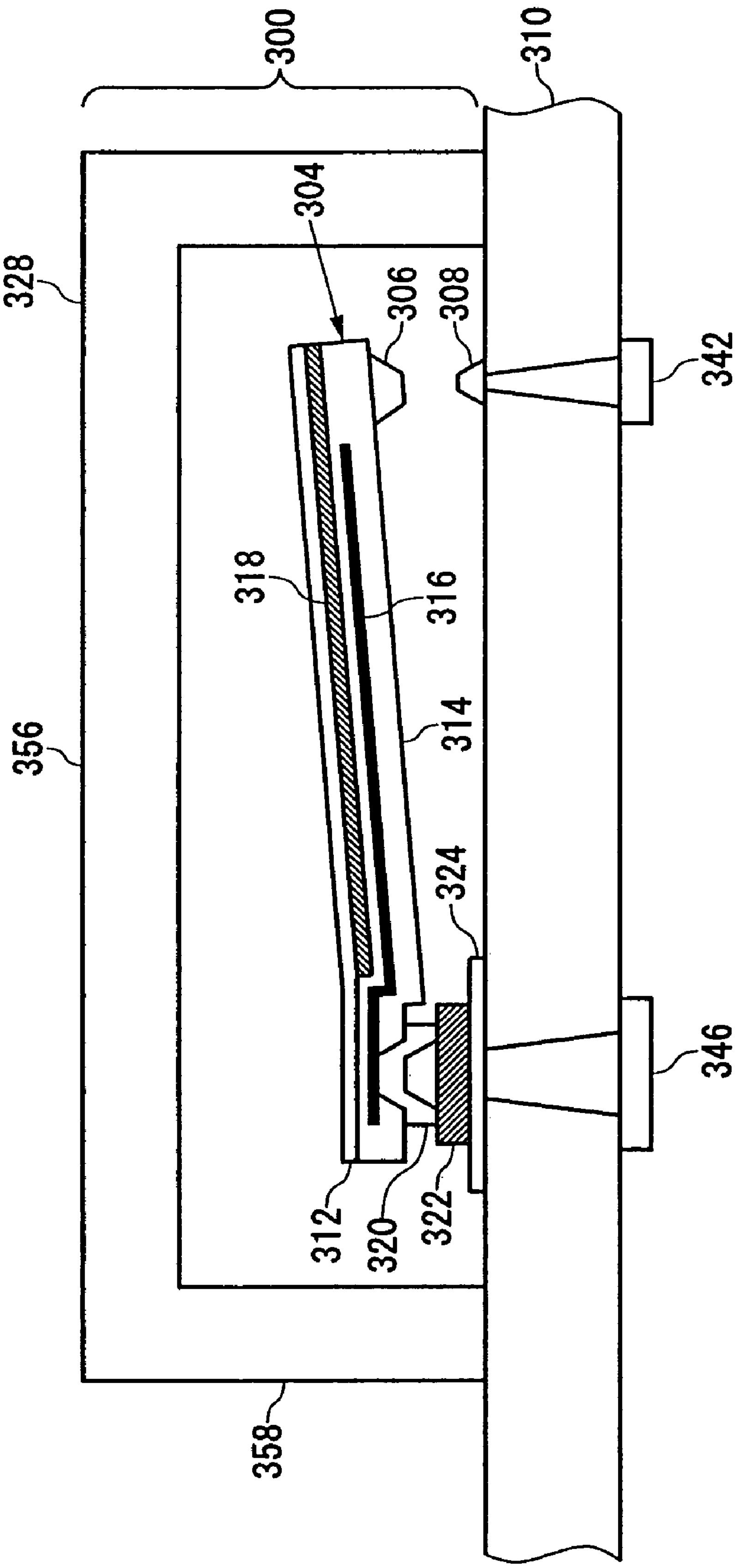
FIG. 14 shows another example of the bimorph switch according to the present embodiment.

FIG. 14 shows another example of the bimorph switch 300 according to the present embodiment. In this example, the bimorph switch 300 further includes a cap 328.

The cap 328 is a lid section which contacts the front face of the switch substrate 310 at its edges, and covers the traveling contact 306, the fixed contact 308, and the bimorph section 304. The cap 328 is formed of silicon. The cap 328 includes: a top cover section 356 having a tabular shape, wherein bimorph section 304 is accommodated between the top cover section 356 and the switch substrate 310; and a side cover sections 358 which extend and are formed on the front face of the switch substrate 310 from the edges of the top cover section 356, and surrounds the sides of the bimorph section 304.

Moreover, the switch substrate 310 includes a wiring 342 and a wiring 346. The wiring 342 and the wiring 346 are formed penetrating the switch substrate 310. A first end of the wiring 342 electrically connects with the fixed contact 308. A second end of the wiring 342 electrically connects with the integrated circuit 352 explained with reference to the FIG. 13. A first end of the wiring 346 electrically connects with the heater electrode wiring 324. A second end of the wiring 346 may electrically connects with the integrated circuit 352. In this case, a heater 316 receives electric power through the integrated circuit 352.

Figure 15A:
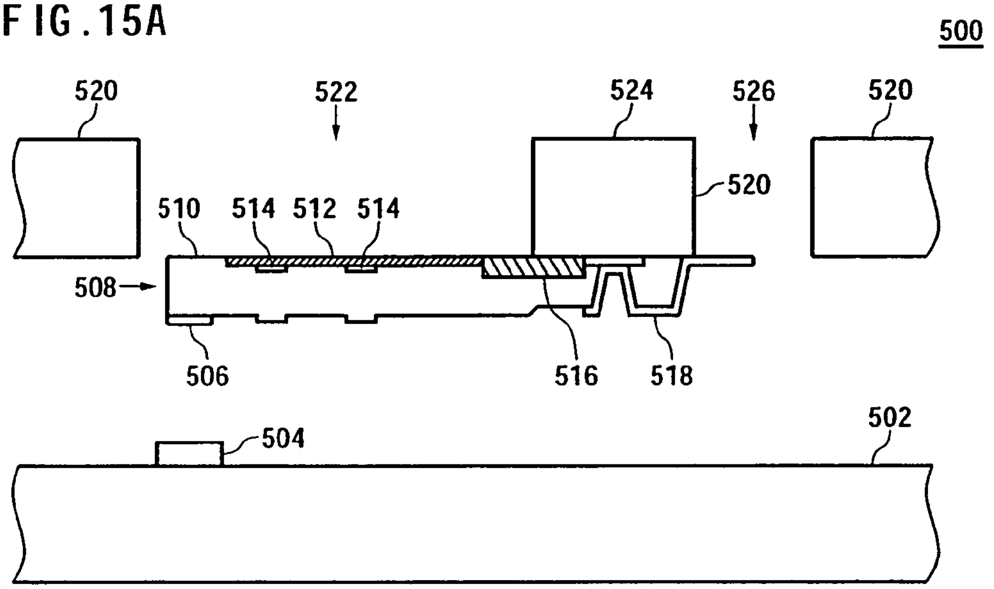
Figure 15B:
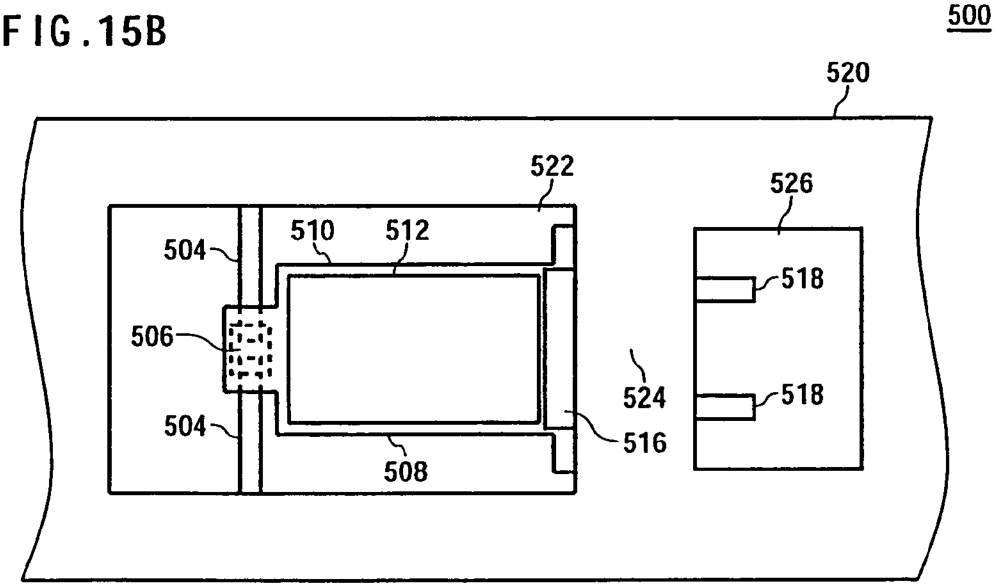

FIGS. 15A and 15B show exemplary bimorph switch 500 according to a fifth embodiment of the present invention. The bimorph switch 500 includes a traveling contact 506, a fixed contact 504, a substrate 502, the bimorph section 508, the heat insulation section 516, and a bimorph support section 524. In the present embodiment, the bimorph switch 500 is a cantilever switch which includes a cantilever.

FIG. 15A is a cross sectional view of the bimorph switch 500 according to the present embodiment. The bimorph switch 500 electrically connects the traveling contact 506 and the fixed contact 504. The traveling contact 506 and the fixed contact 504 are contacts of the switch of the bimorph switch 500. The traveling contact 506 and the fixed contact 504 may be formed of metal. The substrate 502 is a substrate holding the fixed contact 504. The substrate 502 holds the fixed contact 504 on the front face. Moreover, in the present embodiment, the substrate 502 is a glass substrate. In another example, the substrate 502 may be a silicon substrate.

The bimorph section 508 is a portion corresponding to the cantilever of the bimorph switch 500. The bimorph section 508 drives the traveling contact 506. The bimorph section 508 electrically connects the traveling contact 506 and the fixed contact 504 by driving the traveling contact 506. In the present embodiment, the bimorph section 508 has a tabular shape substantially parallel with the front face of the substrate 502. The bimorph section 508 holds the traveling contact 506 on a front face facing the front face of the substrate 502. In the present embodiment, the bimorph section 508 holds the traveling contact 506 in the vicinity of a first end.

The bimorph support section 524 supports the bimorph section 508.

In the present embodiment, the bimorph support section 524 holds the bimorph section 508 at a second end corresponding to the first end at which the bimorph section 508 holds the traveling contact 506. In another example, the bimorph support section 524 may hold both ends of the bimorph section 508. In this case, the bimorph section 508 holds the traveling contact 506 at substantially central part of a front face of the bimorph section 508 facing the substrate 502.

The heat insulation section 516 is heat insulator which reduces the heat transfer from the bimorph section 508 to the bimorph support section 524.

The heat insulation section 516 is formed on the front face of the bimorph section 508 in the present embodiment. The heat insulation section 516 is inserted and formed between the bimorph section 508 and the bimorph support section 524. The heat insulation section 516 substantially covers a part of the bimorph section 508 facing the bimorph support section 524. The heat insulation section 516 contacts the bimorph section 508 and the bimorph support section 524 on front and rear face, respectively. The heat insulation section 516 connects the bimorph section 508 and the bimorph support section 524 on both sides of the heat insulation section 516.

Moreover, the heat insulation section 516 has thermal conductivity lower than the bimorph section 508. It is preferable that the heat insulation section 516 has thermal conductivity lower than any of the bimorph section 508 and the bimorph support section 524. The heat insulation section 516 may be formed of silicon nitride ($SiN_x$).

In addition, in the present embodiment, the bimorph switch 500 further includes the support substrate 520 which supports the bimorph support section 524. The support substrate 520 faces the substrate 502 across the bimorph section 508. The bimorph support section 524 may be integrally formed with the support substrate 520.

Hereafter, it explains in more detail about the bimorph section 508 and the support substrate 520. In the present embodiment, the bimorph section 508 includes a first member 510, a heater 514, a heater electrode 518, and a second member 512. The bimorph section 508 includes a first member 510 and a second member 512 which have different coefficients of thermal expansion with each other. When the bimorph section 508 is heated or cooled, the bimorph section 508 deforms based on the difference in the coefficients of thermal expansion between the first member 510 and the second member 512. The bimorph section 508 drives the traveling contact 506 by the deformation. In the present embodiment, the bimorph section 508 includes the first member 510 formed of silicon oxide, and the second member 512 formed of metal.

When the bimorph section 508 is heated or cooled, the first member 510 and the second member 512 cause stress, which deforms the bimorph section 508. The first member 510 and the second member 512 may cause the stress which incurvates the bimorph section 508 in the direction substantially parallel with the connecting direction of the fixed contact 504 and the traveling contact 506.

The first member 510 is a portion formed over a front face of the bimorph section 508 facing the substrate 502. The first member 510 has a tabular shape substantially parallel with the front face of the substrate 502. The first member 510 holds the traveling contact 506 on a front face facing the front face of the substrate 502.

The heater 514 is a heater which heats the bimorph section 508. In the present embodiment, the heater 514 heats the first member 510 and the second member 512. The heater 514 is made to deform the bimorph section 508 by heating the first member 510 and the second member 512. The heater 514 makes the bimorph section 508 drive the traveling contact 506 by the heating.

The heater 514 is formed on a rear face of the front face holding the traveling contact 506 of the first member 510. The heater 514 may be formed on a part of the rear face. Moreover, the heater electrode 518 is an electrode electrically connecting with the heater 514. The heater electrode 518 may be a metal electrode.

The second member 512 is a metal layer formed on the rear face of the front face, which holds the traveling contact 506, of the first member 510. In the present embodiment, the second member 512 covers the heater 514 and is formed on its rear face. The second member 512 may be formed on a part of the rear face. In the present embodiment, the second member 512 is formed at portions on the rear face other than the domain corresponding to the traveling contact 506. The second member 512 may be formed over the rear face of the front face of the bimorph section 508 facing the front face of the substrate 502.

In the present embodiment, the second member 512, which is metal, includes thermal conductivity higher than the first member 510, which is silicon oxide. The second member 512 includes different coefficient of thermal expansion from that of the first member 510. The second member 512 may cause stress, which deforms the bimorph section 508 when heated by the heater 514. The second member 512 may cause the stress based on the difference in coefficient of thermal expansion from that of the first member 510.

In addition, it is preferable that the heat insulation section 516 has thermal conductivity lower than any of the first member 510 and the second member 512. In the present embodiment, the heat insulation section 516 has thermal conductivity lower than any of silicon oxide and metal.

The support substrate 520 includes a first through hole 522, a second through hole 526, and a bimorph support section 524. The support substrate 520 may be a silicon substrate.

Each of the first through hole 522 and the second through hole 526 is a through hole penetrating from a front face of the support substrate facing the substrate 502 to its rear face. The first through hole 522 accommodates a part of the bimorph section 508 when the bimorph section 508 curves in the direction of disconnecting the fixed contact 504 and the traveling contact 506. The second through hole 526 is electrode output port corresponding to the heater electrode 518. It is preferable that the second through hole 526 exposes a part of the front face of the heater electrode 518 facing the support substrate 520.

In the present embodiment, the bimorph support section 524 is a part of the support substrate 520. The bimorph support section 524 is a portion sandwiched by the first through hole 522 and the second through hole 526 of the support substrate 520. The bimorph support section 524 faces the bimorph section 508 across the heat insulation section 516.

In another example, the bimorph support section 524 may be formed on the front face of the substrate 502. In this case, the heat insulation section 516 faces the substrate 502 across the bimorph support section 524.

FIG. 15B is a plan view of the bimorph switch 500 according to the present embodiment. In the present embodiment, the bimorph switch 500 includes a plurality of fixed contacts 504. The bimorph switch 500 electrically connects the plurality of fixed contacts 504 with each other by electrically connecting each of the plurality of fixed contacts 504 and the traveling contact 506.

In the present embodiment, the bimorph support section 524 and the bimorph section 508 sandwiches the heat insulation section 516, which is a heat insulation member. According to the present embodiment, effluence of the heat, which is generated by the heater 514, from the bimorph section 508 to the bimorph support section 524 can be reduced. Thereby, the power consumption of the bimorph switch 500 can be reduced.

In another example, the bimorph switch 500 may be a doubly supported beam switch. In this case, the bimorph switch 500 includes a plurality of heat insulation sections 516 corresponding to both ends of the bimorph section 508. The bimorph support section 524 holds the ends of the bimorph section 508. The bimorph support section 524 may face an end of the bimorph section 508 across one of the heat insulation sections 516, and may face another end of the bimorph section 508 across another heat insulation section 516.

Figure 16A:
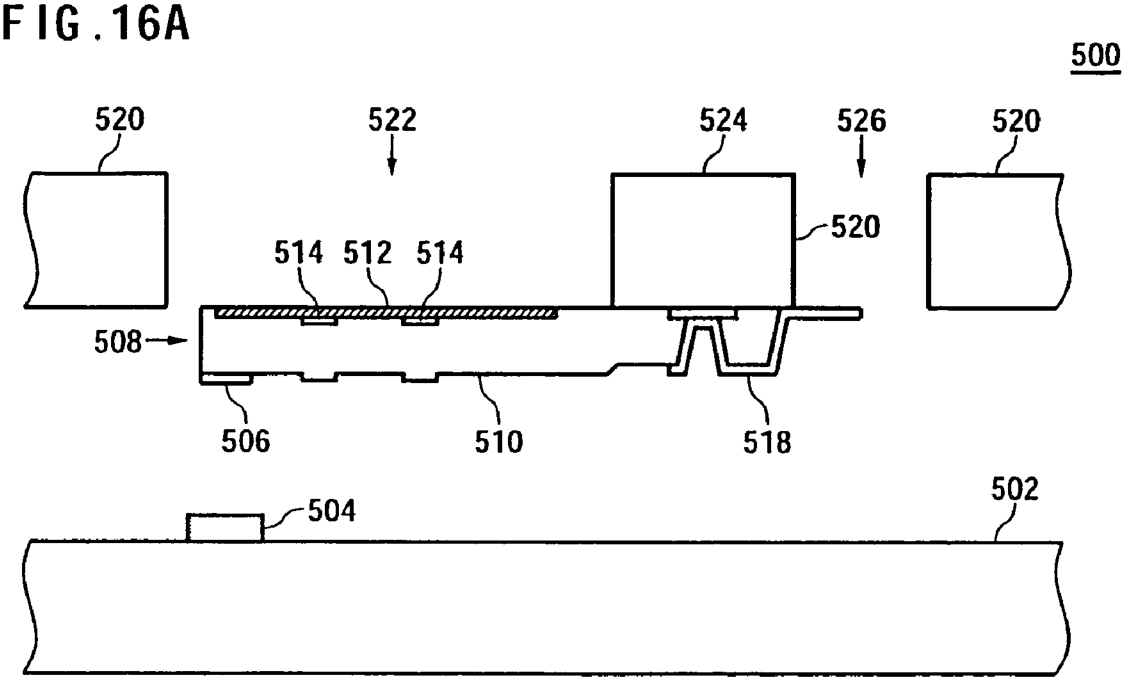
Figure 16B:
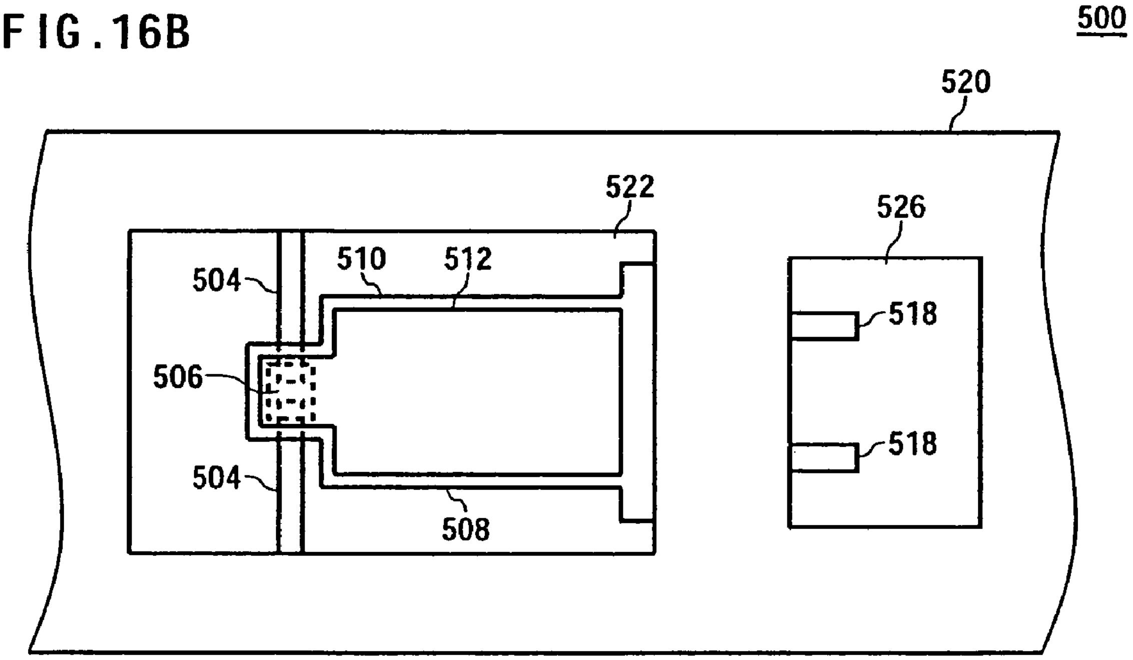

FIGS. 16A and 16B shows other examples of the bimorph switch 500 according to the present embodiment. In FIGS. 16A and 16B, the component which bears the same reference numeral as FIGS. 15A and 15B has the same or similar function as/to that of the component in FIGS. 15A and 15B. FIG. 16A is a cross sectional view of the bimorph switch 500. FIG. 16B is a plan view of the bimorph switch 500. In this example, the bimorph switch 500 includes a traveling contact 506, a fixed contact 504, a substrate 502, a bimorph section 508, and a bimorph support section 524.

In this example, the first member 510 contacts the bimorph support section 524. The second member 512 is formed at a portion other than the domain where the first member 510 contacts and the bimorph support section 524 on the front face of the first member 510 being in contact with the bimorph support section 524.

In this example, the first member 510 having thermal conductivity lower than the second member 512 contacts the bimorph support section 524. Therefore, according to this example, compared with the case where the second member 512 contacts the bimorph support section 524, heat transfer from the bimorph section 508 to the bimorph support section 524 can be reduced. Therefore, also in this example, the effluence of the heat generated by the heater 514 from the bimorph section 508 to the bimorph support section 524 can be reduced. Thereby, the power consumption of the bimorph switch 500 can be reduced.

Figure 17A:
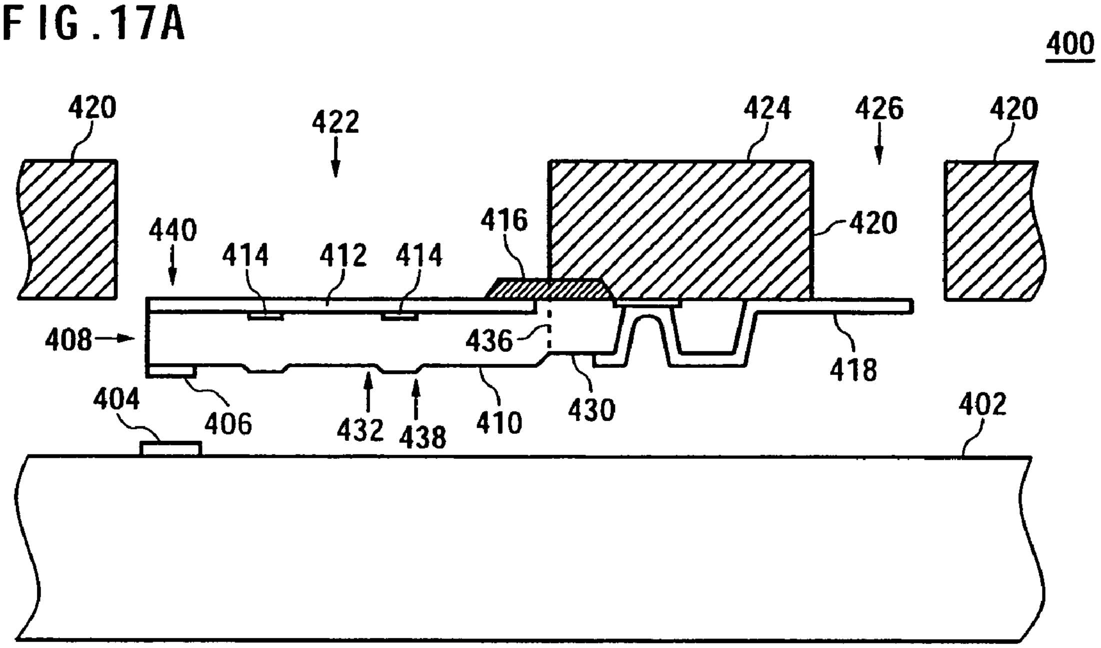
Figure 17B:
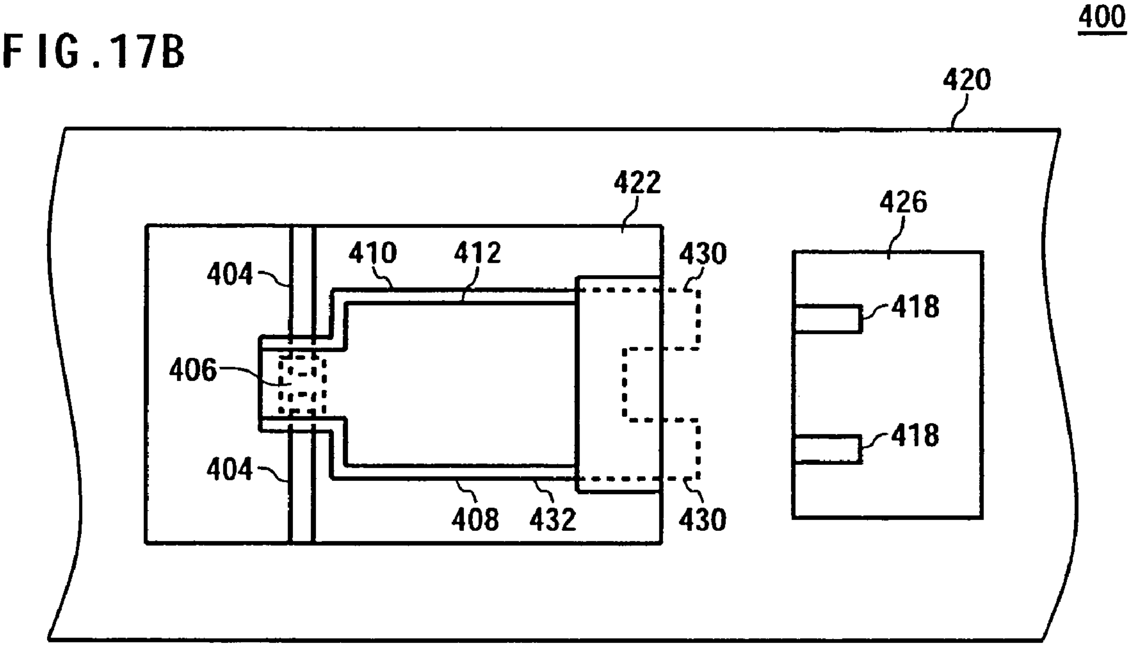

FIGS. 17A and 17B shows an exemplary bimorph switch 400 according to a sixth embodiment of the present invention. The bimorph switch 400 includes a traveling contact 406, a fixed contact 404, a substrate 402, a bimorph section 408, and a support substrate 420. In the present embodiment, the bimorph switch 400 is a cantilever switch which includes a cantilever.

FIG. 17A is a cross sectional view of the bimorph switch 400 according to the present embodiment. The bimorph switch 400 connects the traveling contact 406 and the fixed contact 404 electrically. The traveling contact 406, the fixed contact 404, the substrate 402, and the support substrate 420 have the same or similar function as/to that of the traveling contact 506, the fixed contact 504, the substrate 502, and the support substrate 520 explained with reference to FIGS. 15A and 15B. The substrate 402 may be a substrate holding the fixed contact 404.

The support substrate 420 includes a first through hole 422, a second through hole 426, and a bimorph support section 424. The first through hole 422, the second through hole 426, and the bimorph support section 424 has the same or similar function as/to that of the first through hole 522, the second through hole 526, and the bimorph support section 524 explained with reference to FIGS. 15A and 15B. The bimorph support section 424 supports the bimorph section 408.

The bimorph section 408 is a portion corresponding to the cantilever of the bimorph switch 400. The bimorph section 408 includes a first side 438 facing the substrate 402 and a second side 440 facing the support substrate 420. The bimorph section 408 drives the traveling contact 406. The bimorph section 408 connects the traveling contact 406 and the fixed contact 404 electrically by driving the traveling contact 406. In the present embodiment, the bimorph section 408 has a tabular shape substantially parallel with the front face of the substrate 402. The bimorph section 408 holds the traveling contact 406 on the first side 438. In the present embodiment, the bimorph section 408 holds the traveling contact 406 in the vicinity of a first end.

Hereafter, it explains in more detail about the bimorph section 408. In the present embodiment, the bimorph section 408 includes a driving section 432, a supported section 430, a reinforcement section 416, a heater 414, and a heater electrode 418.

The supported section 430 is fixed to the bimorph support section 424.

In the present embodiment, the supported section 430 is formed in a domain between the bimorph support section 424 and the substrate 402. Moreover, the supported section 430 faces the bimorph support section 424 across a part of the reinforcement section 416.

The driving section 432 drives the traveling contact 406. The driving section 432 extends from the supported section 430 towards out of the domain sandwiched between the bimorph support section 424 and the substrate 402 substantially parallel with the front face of the substrate 402. The driving section 432 may connects with the supported section 430 at the interface of the sandwiched domain. The driving section 432 has a tabular shape substantially parallel with the front face of the substrate 402. The driving section 432 faces the supported section 430 across a boundary 436.

In the present embodiment, the driving section 432 includes a first member 410 and a second member 412 which have different coefficients of thermal expansion from each other. When the driving section 432 is heated or cooled, the driving section 432 deforms based on the difference in the coefficients of thermal expansion between the first member 410 and the second member 412. The driving section 432 drives the traveling contact 406 by the deformation. In the present embodiment, the driving section 432 includes the first member formed of the silicon oxide, and the second member formed of metal.

The first member 410 is a portion formed over a front face of the driving section 432 facing the front face of the substrate 402. The first member 410 has a tabular form substantially parallel with the front face of the substrate 402. The first member 410 holds the traveling contact 406 on the front face facing the substrate 402. In the present embodiment, the first member 410 is integrally formed with the supported section 430.

The second member 412 is a metal layer formed on the rear face of the front face holding the traveling contact 406 of the first member 410. The second member 412 may be formed on a part of the rear face. The second member 412 may be formed over the rear face of the front face of the driving section 432 facing the front face of the substrate 402. The second member 412 may be formed by further extending on the front face of the supported section 430.

The reinforcement section 416 is a reinforcement member which reinforces the boundary 436 of the supported section 430 and the driving section 432. The reinforcement section 416 is formed on the second side 440 from the supported section 430 to a part of driving section 432, which is a front face of the bimorph section 408. In the present embodiment, the reinforcement section 416 is formed over a part of driving section 432 from a part of supported section 430. Moreover, at least a part of the reinforcement section 416 is sandwiched between the bimorph support section 424 and the supported section 430. The reinforcement section 416 may be formed of silicon oxide. The reinforcement section 416 may be formed of silicon nitride. It is preferable that the reinforcement section 416 has thermal conductivity lower than the first member 410.

The heater 414 is a heater which heats the bimorph section 408. In the present embodiment, the heater 414 heats the driving section 432. The heater 414 heats the first member 410 and the second member 412. The heater 414 deforms the driving section 432 by heating the first member 410 and the second member 412. The heater 414 makes the driving section 432 drive the traveling contact 406 by the heating. In the present embodiment, the heater 414 is inserted and formed between the first member 410 and the support substrate 420. Moreover, the heater electrode 418 is an electrode electrically connecting with the heater 414. The heater electrode 518 may be a metal electrode.

FIG. 17B is a plan view of the bimorph switch 400 according to the present embodiment. In the present embodiment, the bimorph switch 400 includes a plurality of fixed contacts 404. The bimorph switch 400 electrically connects the plurality of fixed contacts 404 with each other by electrically connecting each of the plurality of fixed contacts 404 and the traveling contact 406.

In the present embodiment, the reinforcement section 416 reinforces the boundary of the supported section 430 and the driving section 432 of the bimorph section 408. According to the present embodiment, when the bimorph section 408 drives the traveling contact 406, the bimorph section 508 can be reinforced against the stress caused at the interface of the supported section 430 and the driving section 432. Therefore, according to the present embodiment, the bimorph switch 500 may have high durability.

In another example, the bimorph switch 400 may be a doubly supported beam switch. In this case, the bimorph section 408 includes a plurality of supported sections 430 and a plurality of reinforcement sections 416 corresponding to a first end and a second end, respectively. The bimorph support sections 424 hold both ends of the bimorph section 408. One of the bimorph support sections 424 faces one of the supported sections 430 at the first end of the bimorph section 408 across one of the reinforcement sections 416, and faces another supported section 430 at the second end of the bimorph section 408 across another reinforcement section 416. Moreover, in this case, the bimorph section 408 holds the traveling contact 406 at substantially central part of a front face of the bimorph section 408 facing the substrate 402.

Figure 18A:
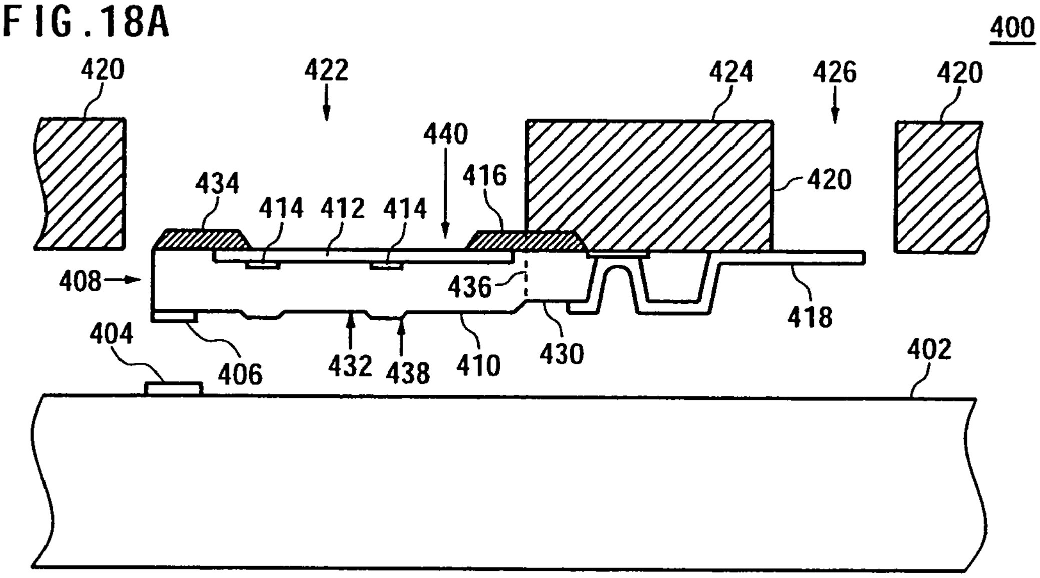
Figure 18B:
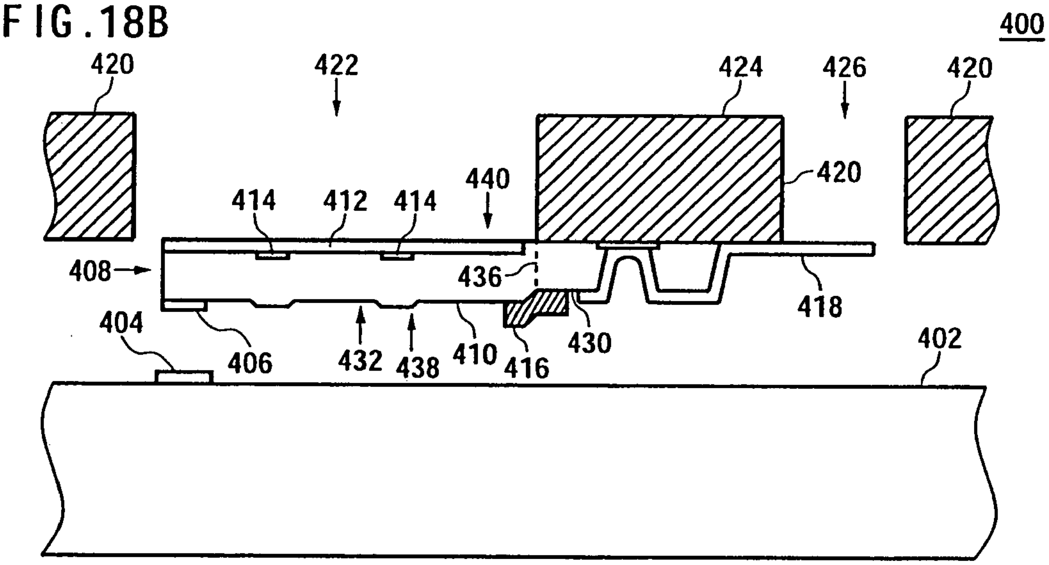
Figure 18C:
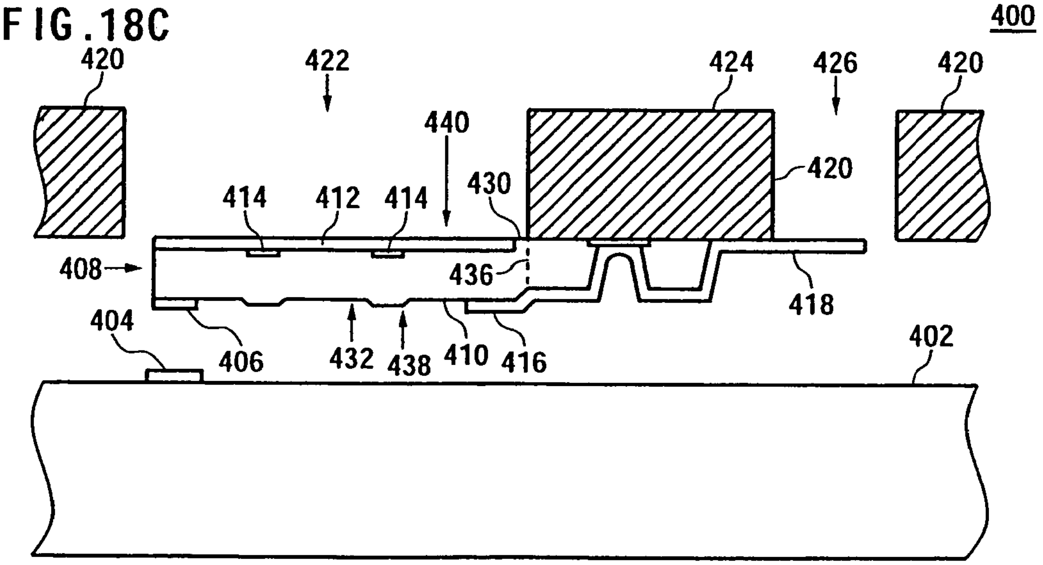

FIGS. 18A-18C show another example of the bimorph switch 400 according to the present embodiment. In FIGS. 18A-18C, the component which bears the same reference numeral as FIGS. 17A and 17B has the same or similar function as/to that of the component in FIGS. 17A and 17B. In this example shown in FIG. 18A, the bimorph section 408 further includes a second reinforcement section 434. The second reinforcement section 434 covers a part of the boundary of the first member 410 and the second member 412. In this example, the second reinforcement section 434 faces the traveling contact 406 across the first member 410. According to this example, when the heater 414 heats the first member 410 and the second member 412, the bimorph section 508 can be reinforced against the stress caused at the interface of the first member 410 and the second member 412.

FIG. 18B shows another example of the bimorph switch 400 according to the present embodiment. In this example, a part of the reinforcement section 416 faces the bimorph support section 424 across the supported section 430. The reinforcement section 416 is formed on the first side 438 of the bimorph section 408. The reinforcement section 416 may be formed of metal. The reinforcement section 416 may be formed, for example, by gold (Au) plating. The reinforcement section 416 may be silicon oxide. Moreover, the supported section 430 contacts the bimorph support section 424. Also by this example, when the bimorph section 408 drives the traveling contact 406, the bimorph section 508 can be reinforced against the stress caused at the interface of the supported section 430 and the driving section 432.

FIG. 18C shows another example of the bimorph switch 400 according to the present embodiment. In this example, the reinforcement section 416 extends from the heater electrode 418, and is integrally formed with the heater electrode 418. The reinforcement section 416 is formed on a front face of the bimorph section facing the substrate 402. Also by this example, when the bimorph section 408 drives the traveling contact 406, the bimorph section 508 can be reinforced against the stress caused at the interface of the supported section 430 and the driving section 432.

Figure 19:
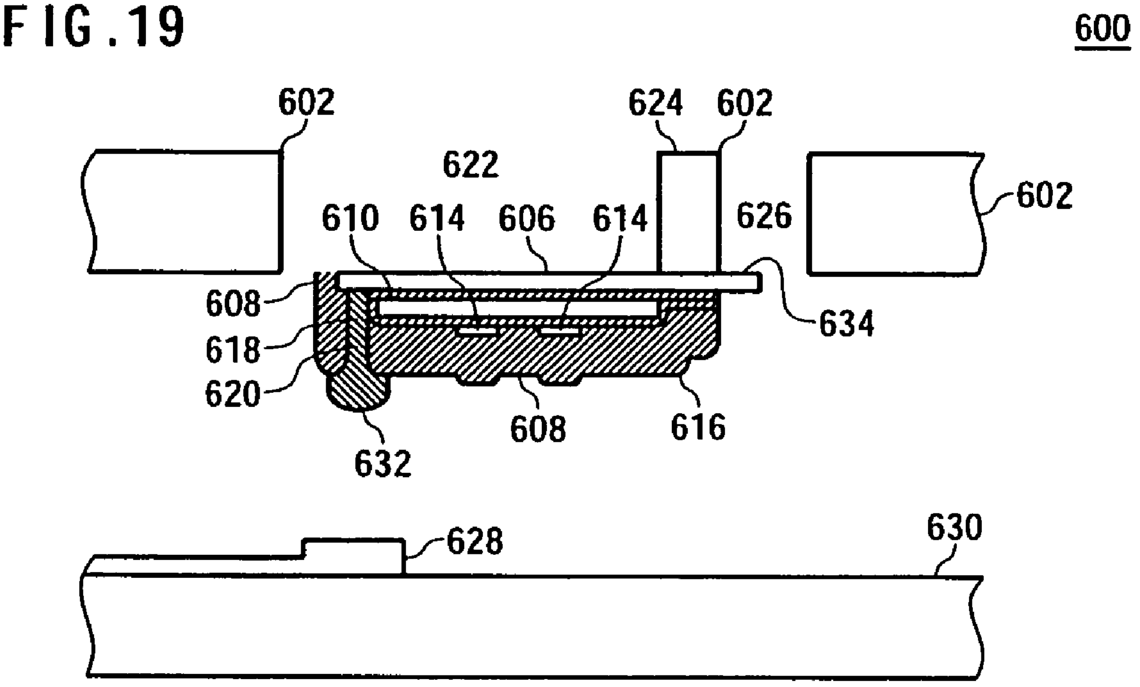
FIG. 19 shows an exemplary bimorph switch according to a seventh embodiment of the present invention.

FIG. 19 shows an exemplary bimorph switch 600 according to a seventh embodiment of the present invention. In the present embodiment, the bimorph switch 600 is a bimorph switch which connects the traveling contact 632 and the fixed contact 628 electrically. The bimorph switch 600 includes a traveling contact 632, a fixed contact 628, a substrate 630, a support substrate 602, and a bimorph section 608. The traveling contact 632, the fixed contact 628, the substrate 630, and the support substrate 602 has the same or similar function as/to that of the traveling contact 506, the fixed contact 504, the substrate 502, and the support substrate 520 explained with reference to FIGS. 15A and 15B. The substrate 630 may be a substrate holding the fixed contact 628.

The support substrate 602 includes a first through hole 622, a second through hole 626, and a bimorph support section 624. The first through hole 622, the second through hole 626, and the bimorph support section 624 has the same or similar function as/to that of the first through hole 522, the second through hole 526, and the bimorph support section 524 explained with reference to FIGS. 15A and 15B. The bimorph support section 624 supports the bimorph section 608.

The bimorph section 608 holds the traveling contact 632 on a front face facing the substrate 630. The bimorph section 608 connects the traveling contact 632 and the fixed contact 628 electrically by driving the traveling contact 632. The bimorph section 608 includes a first member 616, a second member 610, a heater 614, a through hole 618, a feedthrough wiring 620, and a signal line 606. The bimorph section 608 includes a front face facing the substrate 630 and a rear face corresponding to the front face. The through hole 618 penetrates from the front face to the rear face.

The feedthrough wiring 620 is provided in the through hole 618. The feedthrough wiring 620 electrically connects with the traveling contact 632. In the present embodiment, the traveling contact 632 is integrally formed with the feedthrough wiring 620.

The signal line 606 is provided on the rear face of the bimorph section 508, and electrically connects with the feedthrough wiring 620. The signal line 606 electrically connects with the traveling contact 632 through the feedthrough wiring 620.

In the present embodiment, the signal line 606 includes a signal extraction section 634 which further extends from the rear face of the bimorph section 608. The signal line 606 may be projected from a domain between the bimorph support section 624 and the switch substrate 630.

In addition, the first member 616, the second member 610, and the heater 614 may have the same or similar function as/to that of the first member 510, the second member 512, and the heater 514 explained with reference to FIGS. 15A and 15B. Moreover, in the present embodiment, the bimorph support section 624 is formed so that it faces the rear face of the bimorph section 608 across the signal line 606.

In the present embodiment, the bimorph switch 600 includes a signal extraction section 634 electrically connecting with the traveling contact 632. According to the present embodiment, the bimorph switch 600 is a one-contact bimorph switch which connects/disconnects a signal between the traveling contact 632 and the fixed contact 628. The one-contact bimorph switch has durability higher than a two-contact bimorph switch which connects/disconnects a signal between a plurality of fixed contacts. According to the present embodiment, the one-contact bimorph switch which has high durability can be provided.

FIGS. 20A-20F and FIGS. 21A-21E are drawing exemplary showing a bimorph switch manufacturing method for manufacturing the bimorph switch 600 according to the present embodiment. In the present embodiments the bimorph switch manufacturing method includes from a first step to an eleventh step.

Figure 20A:
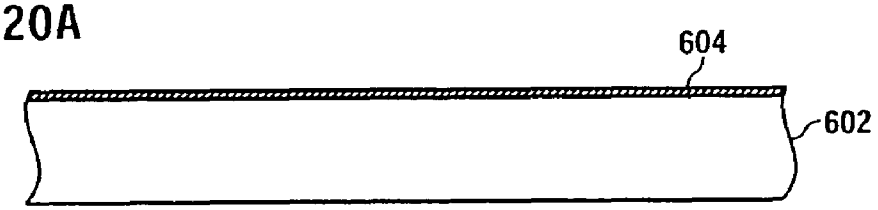

FIG. 20A is drawing explaining the first step. The first step is a preparation step in which a support substrate 602 is prepared. In the present embodiment, in the first step, the support substrate 602 which includes a silicon oxide film 604 on the front face is prepared.

Figure 20B:
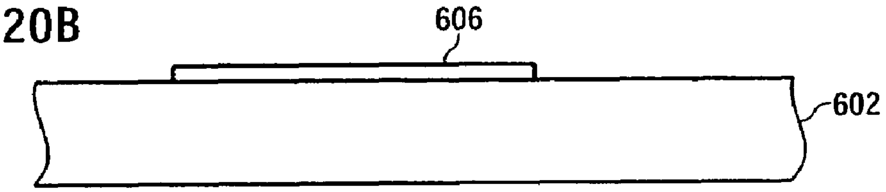

FIG. 20B is a drawing explaining the second step. In the second step, a signal line 606 is formed on the front face of the support substrate 602. In the present embodiment, in the second step, the signal line 606 is formed after removing the silicon oxide film 604 from the front face of the support substrate 602. With photo lithography technology, in the second step, the pattern corresponding to the signal line 606 may be formed and the signal line 606 may be formed based on the pattern. In the second step, the signal line 606 may be formed by gold (Au) plating.

Figure 20C:
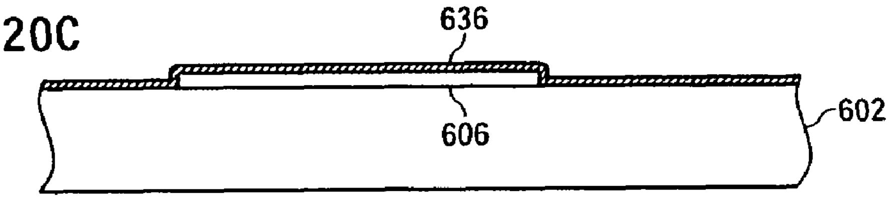

FIG. 20C is a drawing explaining the third step. In the third step, a silicon oxide film 636 which covers the signal line 606 is formed on the front face of the support substrate 602. In the third step, the silicon oxide film 636 by CVD.

Figure 20D:
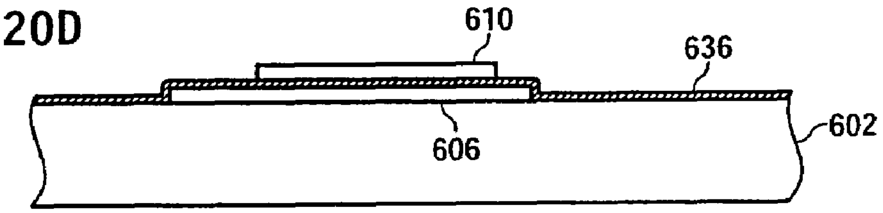

FIG. 20D is a drawing explaining the fourth step. In the fourth step, a second member 610 is formed on the silicon oxide film 636. According to the present embodiment, in the fourth step, the second member 610 is formed on a part of a portion corresponding to the signal line 606 on the silicon oxide film 636. In the fourth step, the second member 610 is formed of metal. The second member 610 is formed so that it faces the signal line 606 across the silicon oxide film 636. The second member 610 faces the signal line 606 across the silicon oxide film 636.

Figure 20E:
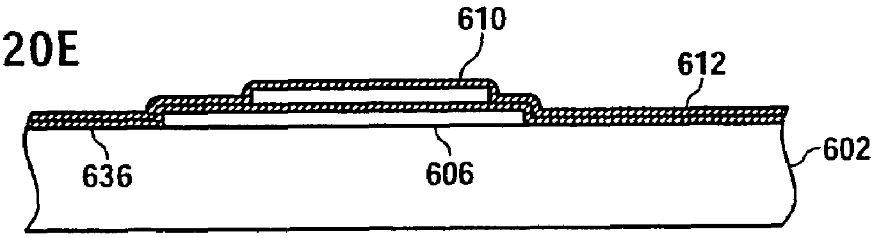

FIG. 20E is a drawing explaining the fifth step. In the fifth step, the silicon oxide film 612 which covers the second member 610 is formed on the silicon oxide film 636. In the fifth step, the silicon oxide film 612 may be formed by CVD.

Figure 20F:
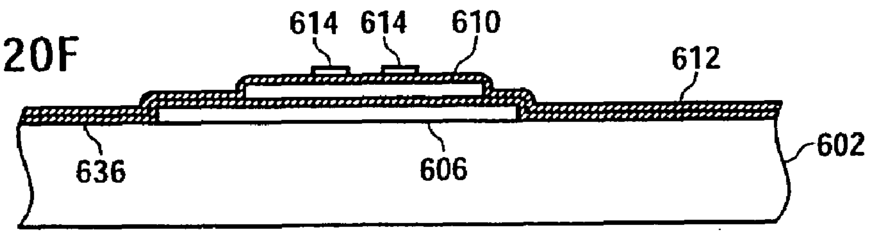

FIG. 20F is a drawing explaining the sixth step. In the sixth step, a heater 614 is formed on the silicon oxide film 612. According to the present embodiment, in the sixth step, the heater 614 is formed on a part of portion corresponding to the second member 610 on the silicon oxide film 612. The heater 614 is formed so that it faces the second member across the silicon oxide film 612. The heater 614 faces the second member across the silicon oxide film 612.

Figure 21A:
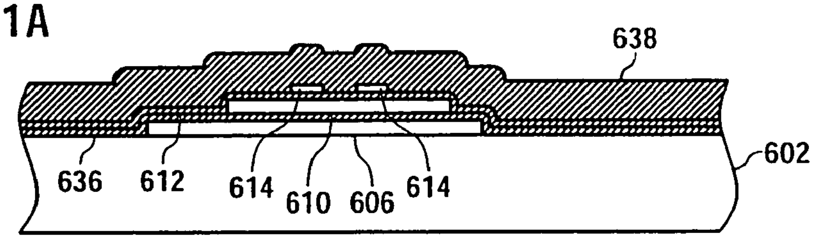

FIG. 21A is a drawing explaining the seventh step. In the seventh step, a silicon oxide film 638 which covers the heater 614 is formed on the silicon oxide film 612.

Figure 21B:
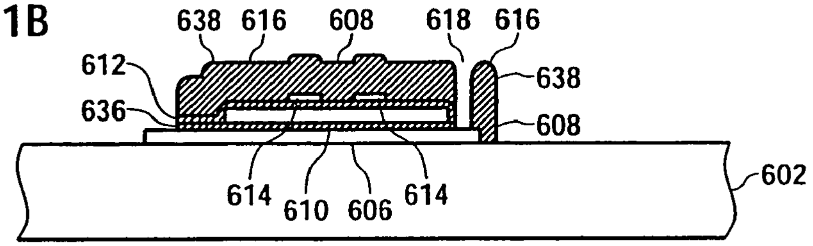

FIG. 21B is a drawing explaining the eighth step. In the eighth step, the silicon oxide film 636, the silicon oxide film 612, and the silicon oxide film 638, which are formed on the predetermined domain of the front face of the support substrate 602, are removed. In the eighth step, the bimorph section 608 is formed by the removal. In the eighth step, portions other than the domain corresponding to the bimorph section 608 on the silicon oxide film 636, the silicon oxide film 612, and the silicon oxide film 638 may be removed. In the present embodiment, in the seventh step, the silicon oxide film 638, which is thicker than any of the silicon oxide film 636 and the silicon oxide film 612, is formed. In the seventh step, the silicon oxide film 638 may be formed by CVD.

In the eighth step, a through hole 618 penetrating from a front face of the bimorph section 608 facing the signal line 606 to its rear face is further formed. The through hole 618 penetrates a portion other than a domain of the bimorph section 608 where the second member 610 is formed. The through hole 618 penetrates a portion other than the domain of the bimorph section 608 where the heater 614 is formed. The through hole 618 may penetrate the bimorph section 608 in the vicinity of one end of the bimorph section 608. In addition, the domain of the bimorph section 608 corresponding to the silicon oxide film 636, the silicon oxide film 612, and the silicon oxide film 638 corresponds to the first member 616.

Figure 21C:
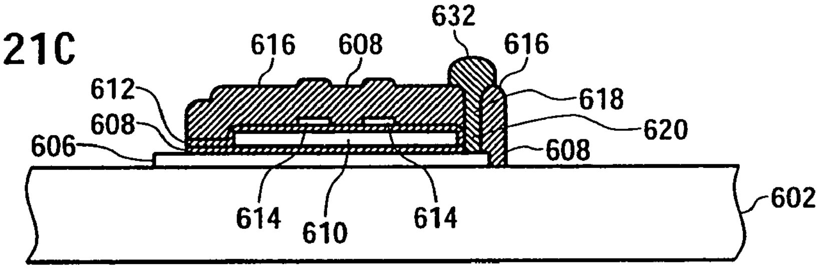
FIG. 21C is a drawing explaining a ninth step.

FIG. 21C is a drawing explaining the ninth step. In the ninth step, a feedthrough wiring 620 is formed in the through hole 618. In the present embodiment, in the ninth step, the feedthrough wiring 620 is formed by filling up the through hole 618 with metal. In the ninth step, the feedthrough wiring 620 may be formed by deposition. In the ninth step, the feedthrough wiring 620 may be formed by plating.

Moreover, in the ninth step, the traveling contact 632 is formed on a rear face of a front face of the bimorph section 608 facing the signal line 606. In the present embodiment, in the ninth step, the traveling contact 632 is integrally formed with the feedthrough wiring 620.

Figure 21D:
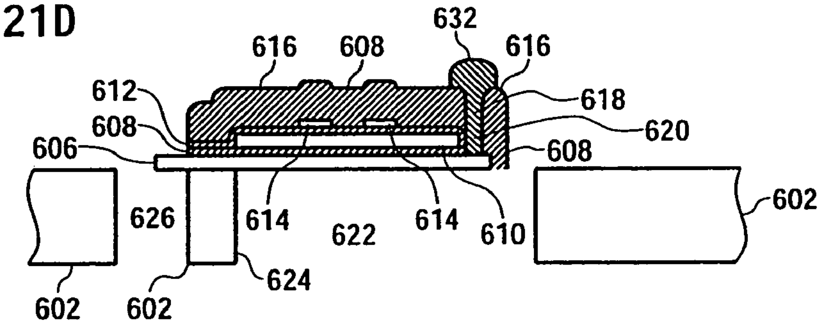
FIG. 21D is a drawing explaining a tenth step.
Figure 21D:
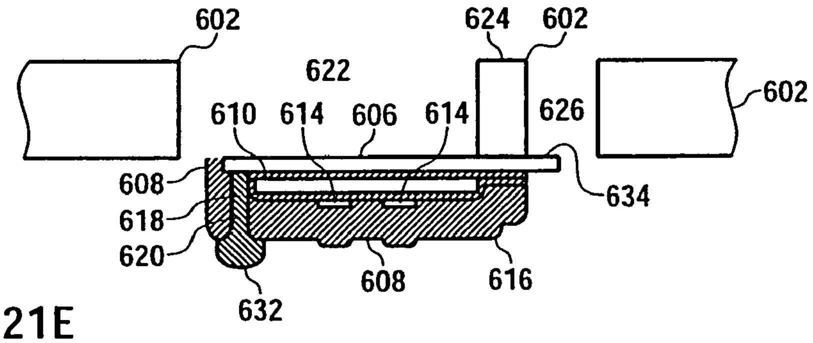

FIG. 21D is a drawing explaining the tenth step. In the tenth step, a first through hole 622 and the second through hole 626 are formed in the support substrate 602. In the present embodiment, in the tenth step, the first through hole 622 and the second through hole 626 are formed by carrying out ICP etching of the support substrate 602 from the rear face of a front face facing the signal line 606. In the tenth step, the bimorph support section 624 is further formed. In the present embodiment, the bimorph support section 624 is a domain between the first through hole 622 and the second through hole 626.

Figure 21E:
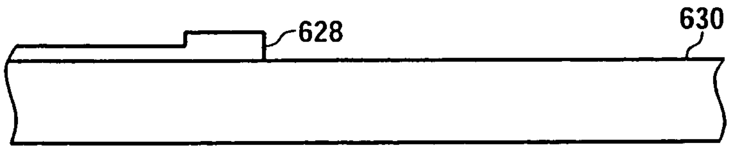
FIG. 21E is a drawing explaining an eleventh step.

FIG. 21E is a drawing explaining the eleventh step. In the eleventh step, a substrate 630 is prepared and the support substrate 602 is made to face the substrate 630. In the present embodiment, in the eleventh step, the substrate 630 which holds the fixed contact 628 on the front face is prepared. In the eleventh step, a front face of the support substrate 602 holding the substrate 630 is made to face a front face of the substrate 630 holding the fixed contact 628.

The substrate 630 holds the support substrate 602 by making the front face of the support substrate 602 holding the signal line 606 face the front face of the substrate 630 holding the fixed contact 628. The substrate 630 holds the support substrate 602 by making the traveling contact 632 face the fixed contact 628. In addition, in the present embodiment, the support substrate 602 is a silicon substrate. The substrate 630 may be a glass substrate.

As is apparent from the above description, according to the present invention, a low cost bimorph switch can be provided.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. An electronic circuitry formed on a substrate, comprising:

an integrated circuit which comprises a first terminal and a second terminal and is formed on the substrate;

a mechanical switch mounted on the substrate comprising a traveling contact, a fixed contact, and a bimorph section, operable to drive said traveling contact and electrically connect the first terminal and the second terminal by electrically connecting said traveling contact and said fixed contact;

a cap comprising a top cover section that covers the traveling contact, the fixed contact, and the bimorph section and a plurality of side cover sections which extend from the edges of the top cover section to the substrate and surround the sides of the bimorph section;

wherein said integrated circuit further comprises a semiconductor switch, and said mechanical switch used for a signal of high frequency switches a signal of frequency higher than that of said semiconductor switch used for a signal of low frequency; and wherein said integrated circuit comprises a semiconductor switch, and said mechanical switch has an off leakage current less than that of said semiconductor switch, and said mechanical switch switches greater current than that of said semiconductor switch.

2. The electronic circuitry formed on a substrate according to claim 1, wherein the cap is formed from silicon.

3. The electronic circuitry formed on a substrate according to claim 1, wherein the top cover section has a tabular shape.

4. An electronic circuitry manufacturing method for manufacturing the electronic circuitry which comprises a mechanical switch and an integrated circuit, comprising:

preparing a substrate;

forming the integrated circuit on the substrate;

forming the mechanical switch; and mounting the mechanical switch on the substrate, said mounting including:

forming a bimorph section on a surface of a sacrificial substrate;

forming a through hole penetrating from the surface of the sacrificial substrate facing the bimorph section to its rear face;

bonding the bimorph section and the switching substrate; and removing the sacrificial substrate.

* * * * *